United States Patent
Hong et al.

(10) Patent No.: US 7,898,353 B2
(45) Date of Patent: Mar. 1, 2011

(54) CLOCK CONDITIONING CIRCUIT

(75) Inventors: Merit Y. Hong, Chandler, AZ (US); Bruce M. Newman, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 97 days.

(21) Appl. No.: 12/466,987

(22) Filed: May 15, 2009

(65) Prior Publication Data
US 2010/0289538 A1   Nov. 18, 2010

(51) Int. Cl.
  *H03K 3/00* (2006.01)
  *H03K 3/017* (2006.01)
  *H03K 5/04* (2006.01)
  *H03K 7/08* (2006.01)

(52) U.S. Cl. .......... 332/109; 332/112; 327/176; 327/237

(58) Field of Classification Search .......... 332/109–114; 327/172, 175, 176, 231, 237
See application file for complete search history.

(56) References Cited

U.S. PATENT DOCUMENTS

| | | | |
|---|---|---|---|
| 3,930,169 A | 12/1975 | Kuhn, Jr. | |
| 4,366,394 A | 12/1982 | Clendening et al. | |
| 4,383,373 A | 5/1983 | Couturier | 33/286 |
| 4,567,896 A | 2/1986 | Barnea et al. | 128/660 |
| 4,577,163 A | 3/1986 | Culp | |
| 4,606,059 A | 8/1986 | Oida | |
| 4,629,909 A | 12/1986 | Cameron | |
| 4,722,056 A | 1/1988 | Roberts et al. | 364/413 |
| 4,807,266 A | 2/1989 | Taylor | |
| 5,050,608 A | 9/1991 | Watanabe et al. | 128/653 R |
| 5,056,523 A | 10/1991 | Hotchkiss, Jr. et al. | 128/653 R |
| 5,057,839 A | 10/1991 | Koch | |
| 5,078,140 A | 1/1992 | Kwoh | 128/653.1 |
| 5,088,057 A | 2/1992 | Amrany et al. | |
| 5,122,726 A * | 6/1992 | Elliott et al. | 323/272 |
| 5,142,930 A | 9/1992 | Allen et al. | 74/469 |
| 5,186,174 A | 2/1993 | Schlondorff et al. | 128/653.1 |
| 5,197,476 A | 3/1993 | Nowacki et al. | 128/660.03 |
| 5,198,877 A | 3/1993 | Schulz | 356/375 |
| 5,218,314 A | 6/1993 | Efendovich et al. | |
| 5,222,499 A | 6/1993 | Allen et al. | 128/653.1 |
| 5,230,623 A | 7/1993 | Guthrie et al. | 433/72 |
| 5,251,127 A | 10/1993 | Raab | 364/413.13 |
| 5,299,288 A | 3/1994 | Glassman et al. | 395/80 |
| 5,305,203 A | 4/1994 | Raab | 364/413.13 |
| 5,309,913 A | 5/1994 | Kormos et al. | 128/653.1 |
| 5,355,037 A | 10/1994 | Andresen et al. | |
| 5,383,454 A | 1/1995 | Bucholz | 128/653.1 |
| 5,389,101 A | 2/1995 | Heilbrun et al. | 606/130 |
| 5,392,384 A | 2/1995 | Tounai et al. | 395/89 |
| 5,394,875 A | 3/1995 | Lewis et al. | 128/660.09 |
| 5,563,597 A | 10/1996 | McCartney | |
| 5,383,454 A | 12/1996 | Bucholz | 128/653.1 |
| 5,786,778 A | 7/1998 | Adams et al. | |
| 5,889,436 A | 3/1999 | Yeung et al. | |
| 5,945,858 A | 8/1999 | Sato | |
| 5,970,110 A | 10/1999 | Li | |
| 5,982,315 A | 11/1999 | Bazarjani et al. | |
| 6,157,694 A | 12/2000 | Larsson | |

(Continued)

*Primary Examiner* — David Mis

(57) ABSTRACT

A circuit includes a clock conditioning circuit which receives an encoded clock signal, and provides first and second conditioned clock signals in response. The clock conditioning circuit adjusts a period of the first and second conditioned clock signals in response to an adjustment of a period of the encoded clock signal. The circuit includes a modulator which receives the first and second conditioned clock signals.

20 Claims, 13 Drawing Sheets

U.S. PATENT DOCUMENTS

| | | |
|---|---|---|
| 6,185,691 B1 | 2/2001 | Gandhi et al. |
| 6,194,950 B1 | 2/2001 | Kibar et al. |
| 6,222,895 B1 | 4/2001 | Larsson |
| 6,353,649 B1 | 3/2002 | Bockleman et al. |
| 6,459,753 B2 | 10/2002 | Verlinden |
| 6,480,047 B2 | 11/2002 | Abdel-Maguid et al. |
| 6,498,819 B1 | 12/2002 | Martin |
| 6,556,086 B2 | 4/2003 | Keaveney et al. |
| 6,603,360 B2 | 8/2003 | Kim et al. |
| 6,614,319 B2 | 9/2003 | Saeki et al. |
| 6,617,893 B1 | 9/2003 | Born et al. |
| 6,618,462 B1 | 9/2003 | Ross et al. |
| 6,768,353 B2 | 7/2004 | Carralero et al. |
| 6,839,011 B1 | 1/2005 | Hong |
| 6,944,257 B2 | 9/2005 | Riley |
| 7,068,198 B2 | 6/2006 | Hong et al. |
| 7,180,339 B2 | 2/2007 | Lanier |
| 2002/0101955 A1 | 8/2002 | Poullet |
| 2005/0237090 A1 | 10/2005 | Lanier |
| 2007/0001737 A1 | 1/2007 | Sundararaman |
| 2007/0164884 A1 | 7/2007 | Ihs |
| 2008/0068241 A1 | 3/2008 | Hong |
| 2008/0165041 A1 | 7/2008 | Parkes et al. |
| 2008/0265958 A1 | 10/2008 | Beaulaton et al. |

* cited by examiner

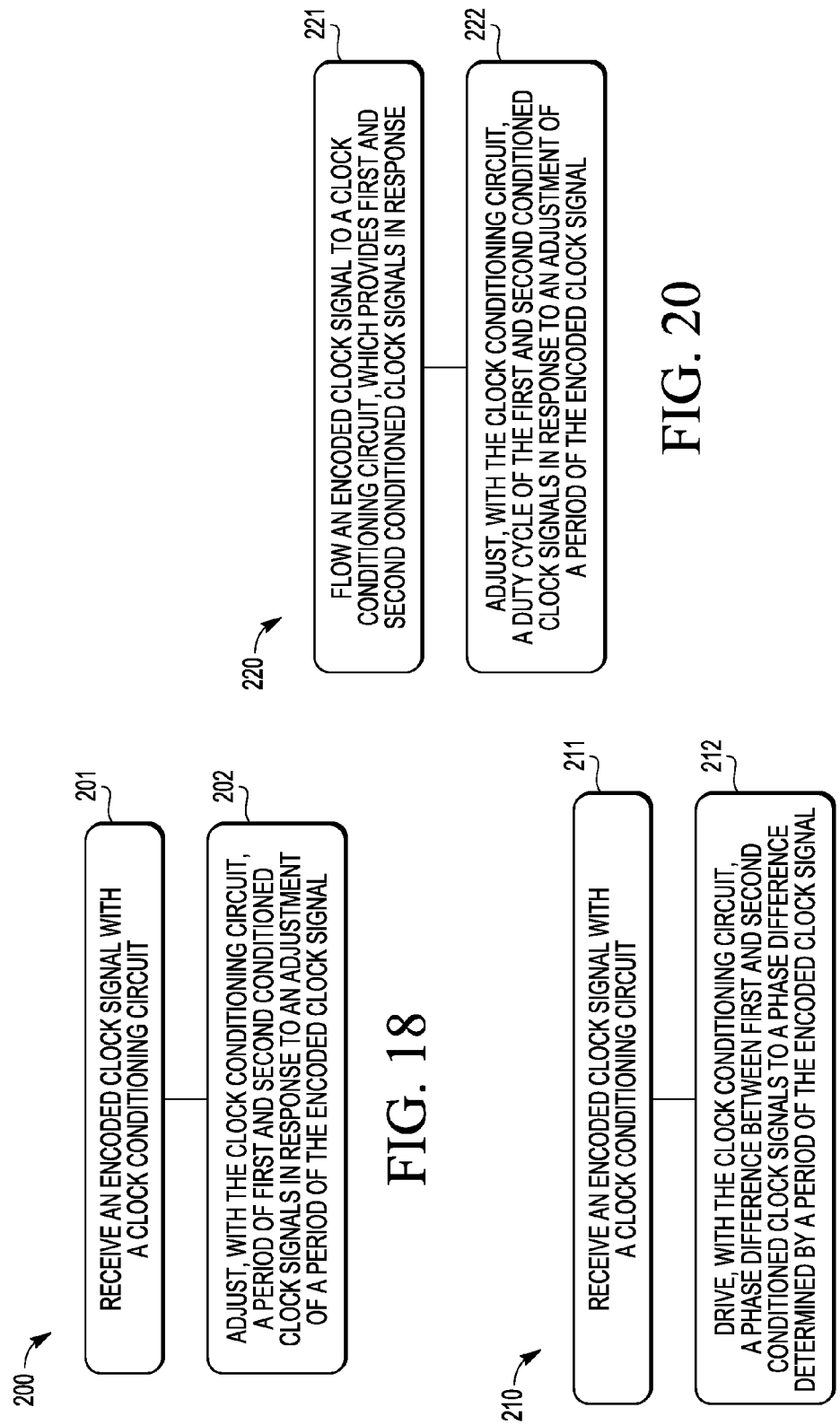

US 7,898,353 B2

CLOCK CONDITIONING CIRCUIT

BACKGROUND

1. Field

The present invention relates to electronic circuits which down convert the frequency of a signal.

2. Related Art

Some electronic circuits operate as signal processing systems which condition, receive and transmit signals. One type of signal processing system utilizes code division multiple access (CDMA), which is a channel access method for signal processing. By contrast, time division multiple access (TDMA) divides access by time, while frequency-division multiple access (FDMA) divides access by frequency. Wideband Code Division Multiple Access (WCDMA) is a wideband spread-spectrum channel access method that utilizes the direct-sequence spread spectrum method of asymmetric code division multiple access to achieve higher speeds and support more signals compared to TDMA systems.

Signal processing systems which implement CDMA or WCDMA methods often include a sigma-delta modulator, which provides a digital output signal in response to receiving an analog input signal. A sigma-delta modulator oversamples the analog input signal with a sampling signal having a sampling frequency $f_{Sample}$ that is greater than the analog input signal bandwidth B. A signal is oversampled when it is sampled at a rate greater than the Nyquist rate $f_N$. The Nyquist rate is the minimum sampling rate required to avoid aliasing, and is equal to two times the highest frequency of the analog input signal ($f_N=2\times B$). The analog input signal is oversampled so that the digital signal is a more accurate representation thereof.

Sampling frequency $f_{Sample}$ is typically related to a reference frequency $f_{REF}$ of a reference clock signal $S_{REF}$. In some signal processing systems, reference frequency $f_{REF}$ is about 1248 MegaHertz (MHz) and 1456 MHz. However, it is sometimes desirable to have sampling frequency $f_{Sample}$ be much lower than reference frequency $f_{REF}$. For example, it is often desirable to have a sampling frequency of 104 MHz (1248 MHz/12=104 MHz), 96 MHz (1248/13=96 Mhz) and 97.067 MHz (1456/15=97.067 MHz) at a 50% duty cycle. Hence, it is desirable to down convert reference frequency $f_{REF}$ to provide a sampling signal with a frequency that is a fractional value of reference frequency $f_{REF}$ (i.e. ⅙, 1/13, 1/15).

Some methods disclose providing sampling frequency $f_{Sample}$ by dividing reference frequency $f_{REF}$ by two different integer values to generate two sub-frequencies, and then averaging the two sub-frequencies. Other methods disclose providing several phase-shifted reference signals, each having frequency $f_{REF}$, and then selecting desired high-to-low and low-to-high transitions to provide the sampling signal. However, both of these methods generate jitter in the sampling signal, which refers to random variations in sampling frequency $f_{Sample}$. The jitter can introduce noise into the digital output signals being provided by the sigma-delta modulator, which reduces the accuracy thereof.

Some methods disclose increasing reference frequency $f_{REF}$ to reduce jitter, and then down converting the increased reference frequency $f_{REF}$ to the desired sampling frequency $f_{Sample}$. However, increasing reference frequency $f_{REF}$ requires an increase in the power consumed by the signal processing system.

It is also desirable to provide sampling signals that have a desired phase difference between them. The phase difference between the sampling signals define time points at which the analog input signal is sampled. The phase difference between sampling signals can randomly change in response to the sampling signals traveling a distance. The phase difference between sampling signals can randomly change because the sampling signals are randomly skewed in response to traveling the distance. The random change in the phase difference between the sampling signals in response to skew is often uncontrollable and can cause jitter, which reduces the accuracy of the digital output signal.

BRIEF DESCRIPTION OF THE DRAWINGS

FIGS. 18, 19, 20 and 21 are methods of providing a conditioned clock signal.

DETAILED DESCRIPTION

Figure 1:
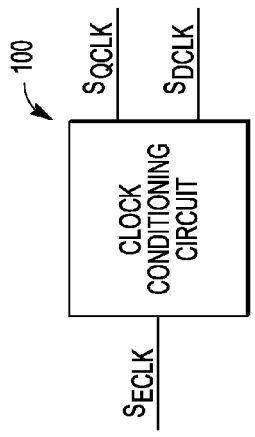
FIG. 1 is a block diagram of one embodiment of a clock conditioning circuit, which receives an encoded clock signal $S_{ECLK}$ and provides clock signals $S_{QCLK}$ and $S_{DCLK}$ in response.

A clock conditioning circuit provides two or more down converted and phase-shifted clock signals, which can be used to drive another circuit, such as a signal conditioning circuit. The clock signals are provided in response to an encoded clock signal provided to the clock conditioning circuit. The encoded clock signal includes information corresponding to a characteristic of the clock signals. The characteristic can be of many different types, such as the period, frequency, phase, symmetry and duty cycle of the clock signals. In general, the encoded clock signal includes the characteristics of multiple clock signals. However, in some embodiments, multiple encoded clock signals are provided to the clock conditioning circuit, wherein the multiple encoded clock signals include the characteristics of multiple clock signals.

The frequency of a signal is related to its period (T) by the well-known relation f=1/T. The signal is periodic when it repeats its values at regular intervals. A local period of a digital signal includes one HI state and one LO state per local clock period. A global period of the digital signal includes one or more of its local periods, which are repeated at regular intervals. It should be noted that some of the signals discussed herein have time varying periods, wherein period T varies as a function of time. The time varying period can be the local period and/or global period.

The encoded clock signal has a time varying period, wherein its local period changes with time between being equal to and unequal to its global period. Hence, the local period of encoded clock signal can be the same as the global period of encoded clock signal during one time interval. Further, the local period of the encoded clock signal can be different from the global period of the encoded clock signal during a different time interval. It should be noted that the global period of a reference clock signal discussed herein is equal to its local period. Hence, the reference clock signals discussed herein do not have a time varying period, wherein its local period changes between being equal to and unequal to its global period.

The clock conditioning circuit disclosed herein includes less complicated and less expensive circuitry to better control the frequency of the clock signals, as well as the phase difference between them. The clock conditioning circuit is capable of providing the desired clock signals with a reduced amount of jitter. Further, the clock conditioning circuit is capable of providing the desired clock signals without requiring an increase in frequency $f_{REF}$ to reduce the amount of jitter. In this way, the clock conditioning circuit provides the desired clock signals without increasing the amount of power consumed by the signal processing system.

Examples of signal conditioning circuits include analog-to-digital converters (ADCs) and digital-to-analog converters (DACs). An ADC converts an analog signal to a digital signal, and a DAC converts the digital signal to the analog signal. The ADC samples the analog signal at a sampling rate $f_{Sample}$, which determines the accuracy with which the analog signal is resolved and represented by the digital signal.

A sigma-delta modulator is another type of signal conditioning circuit. In one example, the sigma-delta modulator includes a quantizer which samples an analog input signal $S_{Input}$ at sampling rate $f_{Sample}$ of a first clock signal, and provides a corresponding digital output signal $S_{Output}$. The sigma-delta modulator includes a DAC which converts digital output signal $S_{Output}$ at the sampling rate $f_{Sample}$ of a second clock signal, and provides a converted analog input signal $S_{Converter}$ in response. The sigma-delta modulator combines and filters signals $S_{Input}$ and $S_{Converter}$, and provides the resultant signal to the quantizer so that it is sampled at sampling rate $f_{Sample}$. In general, digital output signal $S_{Output}$ is a more accurate representation of analog input signal $S_{Input}$ as the difference between signals $S_{Input}$ and $S_{Converter}$ decreases. Further, digital output signal $S_{Output}$ is a less accurate representation of analog input signal $S_{Input}$ as the difference between signals $S_{Input}$ and $S_{Converter}$ increases.

The quantizer samples analog input signal $S_{Input}$ at sampling rate $f_{Sample}$, and the difference between signals $S_{Input}$ and $S_{Converter}$ depends on the phase difference between the first and second clock signals. Sampling rate $f_{Sample}$ and the phase difference between the first and second clock signals determine the accuracy with which analog input signal $S_{Input}$ is resolved and represented by digital output signal $S_{Output}$. In this way, the clock conditioning circuit drives the sigma-delta modulator.

The clock conditioning circuit disclosed herein is capable of providing the first and second clock signals with frequency $f_{Sample}$ by down converting reference frequency $f_{REF}$. Further, the clock conditioning circuit is capable of adjusting the first and second clock signals by adjusting sampling rate $f_{Sample}$, as well as the phase difference between them. The clock conditioning circuit is capable of providing first and second clock signals having an asymmetric duty cycle, as well as providing first and second clock signal having a symmetric duty cycle.

The clock signal(s) provided by the clock conditioning circuit are related to a reference clock signal $S_{REF}$ by an encoded clock signal $S_{ECLK}$. For example, the clock signal(s) provided by the clock conditioning circuit have a frequency (f) that is related to the frequency $f_{REF}$ of reference clock signal $S_{REF}$ by a fractional multiple N, wherein the fractional multiple is determined by encoded clock signal $S_{ECLK}$. The relationship between the frequencies of the clock signal and the reference clock signal $S_{REF}$ is given by $f = N \times f_{REF}$. The clock signal(s) provided by the clock conditioning circuit have a period that is related to the period $T_{REF}$ of reference clock signal $S_{REF}$ by the fractional multiple N. The relationship between the periods of the clock signal and the reference clock signal $S_{REF}$ is given by $T_{REF} = T \times N$.

In some signal processing systems, the available reference clock signals are at frequencies $f_{REF}$ of 1248 MHz and 1456 MHz. Reference clock signals with frequencies $f_{REF}$ of 1248 MHz and 1456 MHz are useful in telecommunications systems, such as cell phone networks. The clock conditioning circuit provides a clock signal having a frequency f that is related to frequency $f_{REF}$ by the relationship $f = N \times f_{REF}$. In one particular example, $f_{REF} = 1248$ MHz and $N = \frac{1}{12}$ so that $f = 104$ MHz (1248 MHz/12=104 MHz). In another particular example, $f_{REF} = 1248$ MHz and $N = \frac{1}{13}$ so that $f = 96$ MHz (1248/13=96 MHz). In one example, $f_{REF} = 1456$ MHz and $N = \frac{1}{15}$ so that $f = 97.067$ MHz (1456/15=97.067 MHz). As discussed in more detail below, the reference clock signal provided to the signal processing system can be changed between reference clock signals having different reference frequencies.

The phase difference of the clock signal(s) provided by the clock conditioning circuit are related to reference clock signal $S_{REF}$ by encoded clock signal $S_{ECLK}$. For example, the clock signal(s) provided by the clock conditioning circuit have a phase difference $\phi$ that is related to period $T_{REF}$ of reference clock signal $S_{REF}$ by fractional multiple N. Hence, the clock conditioning circuit is capable of adjusting the phase difference between the clock signals in response to an adjustment of encoded clock signal $S_{ECLK}$.

It should be noted that the clock signals discussed herein are digital signals which alternate between HI and LO states. For simplicity and ease of discussion, the digital signals each have one HI state and one LO state per local clock signal period, wherein the HI state corresponds with a logic '1' and the LO state corresponds with a logic '0'. The digital signals each have one HI state and one LO state per local clock signal period so that there is one rising edge and one falling edge per local clock signal period. Hence, the local period of a digital signal begins at about its rising edge and terminates at about the next rising edge. It should also be noted that the clock conditioning circuit can be responsive to the rising or falling edges of the digital signal. For simplicity and ease of discussion, the clock conditioning circuit discussed herein is responsive to the rising edge of a digital signal. Some of the clock signals discussed herein have time varying periods. In general, the duration of the HI and LO states of clock signals having time varying periods vary from one local period to another.

FIG. 1 is a block diagram of one embodiment of a clock conditioning circuit 100. In this embodiment, clock conditioning circuit 100 receives encoded clock signal $S_{ECLK}$, and provides clock signals $S_{QCLK}$ and $S_{DCLK}$ in response. Clock signals $S_{QCLK}$ and $S_{DCLK}$ are related to reference clock signal $S_{REF}$ by encoded clock signal $S_{ECLK}$, and can be used to drive another circuit, such as the sigma-delta modulator described above. For the sigma-delta modulator, clock signals $S_{QCLK}$ and $S_{DCLK}$ are provided to a quantizer and DAC, respectively, as discussed in more detail below with FIG. 16. The frequencies of clock signals $S_{QCLK}$ and $S_{DCLK}$ are the sampling frequency discussed above. In this way, clock signals $S_{QCLK}$ and $S_{DCLK}$ are used to sample an analog input signal at sampling rate $f_{Sample}$ so that a corresponding digital output signal is provided in response.

As discussed in more detail below, clock conditioning circuit 100 is capable of adjusting a characteristic of clock signals $S_{QCLK}$ and $S_{DCLK}$ in response to receiving encoded clock signal $S_{ECLK}$. For example, clock conditioning circuit 100 is capable of adjusting the frequency and period of clock signals $S_{QCLK}$ and $S_{DCLK}$ in response to receiving encoded clock signal $S_{ECLK}$. Further, clock conditioning circuit 100 is capable of adjusting the duty cycles of clock signals $S_{QCLK}$ and $S_{DCLK}$ in response to receiving encoded clock signal $S_{ECLK}$. Clock conditioning circuit 100 is also capable of adjusting the phase difference between clock signals $S_{QCLK}$ and $S_{DCLK}$ in response to receiving encoded clock signal $S_{ECLK}$. Clock conditioning circuit 100 is capable of adjusting the symmetry of clock signals $S_{QCLK}$ and $S_{DCLK}$ in response to receiving encoded clock signal $S_{ECLK}$. In this way, encoded clock signal $S_{ECLK}$ is encoded with information regarding the period, frequency, phase, symmetry and duty cycle of clock signals $S_{QCLK}$ and $S_{DCLK}$.

Encoded clock signal $S_{ECLK}$ is encoded so that clock signals $S_{QCLK}$ and $S_{DCLK}$ are related to reference clock signal $S_{REF}$. For example, the periods of clock signals $S_{QCLK}$ and $S_{DCLK}$ are related to the period of reference clock signal $S_{REF}$ by encoded clock signal $S_{ECLK}$. Encoded clock signal $S_{ECLK}$ has local periods with durations which correspond to a predetermined number of periods of reference clock signal $S_{REF}$. The number of periods of reference clock signal $S_{REF}$ that correspond to the duration of a local period of encoded clock signal $S_{ECLK}$ is adjustable. Adjacent local periods of encoded clock signal $S_{ECLK}$ can have durations which correspond to a different number of periods of reference clock signal $S_{REF}$. In this way, adjacent local periods of encoded clock signal $S_{ECLK}$ have durations which are adjustable relative to each other. Clock conditioning circuit 100 adjusts the periods of clock signals $S_{QCLK}$ and $S_{DCLK}$ in response to an adjustment of the period of encoded clock signal $S_{ECLK}$. The periods of clock signals $S_{QCLK}$ and $S_{DCLK}$ can be defined in many different ways. However, as mentioned above, each clock signal $S_{QCLK}$ and $S_{DCLK}$ has one HI state and one LO state per corresponding local clock signal period T.

Figure 2:
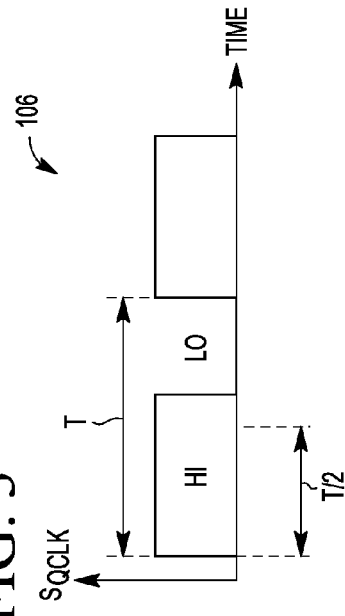
FIG. 2 shows a graph of one example of clock signals $S_{QCLK}$ and $S_{DCLK}$, wherein clock signals $S_{QCLK}$ and $S_{DCLK}$ are provided by the clock conditioning circuit of FIG. 1.

FIG. 2 shows a graph 105 of one example of clock signals $S_{QCLK}$ and $S_{DCLK}$ verses time. In FIG. 2, the HI and LO states of clock signals $S_{QCLK}$ and $S_{DCLK}$ each have a duration of T/2. Further, each clock signal $S_{QCLK}$ and $S_{DCLK}$ has one HI state and one LO state per corresponding local clock signal period T. Each clock signal $S_{QCLK}$ and $S_{DCLK}$ has one HI state and one LO state per local clock signal period T so that there is one rising edge and one falling edge per local clock signal period T. Clock signals $S_{QCLK}$ and $S_{DCLK}$ are digital signals which alternate between HI and LO states.

Clock conditioning circuit 100 adjusts the periods of clock signals $S_{QCLK}$ and $S_{DCLK}$ in response to a change in the period of encoded clock signal $S_{ECLK}$. Clock conditioning circuit 100 increases the periods of clock signals $S_{QCLK}$ and $S_{DCLK}$ in response to an increase in the period of encoded clock signal $S_{ECLK}$. Further, clock conditioning circuit 100 decreases the periods of clock signals $S_{QCLK}$ and $S_{DCLK}$ in response to a decrease in the period of encoded clock signal $S_{ECLK}$. It should be noted that clock conditioning circuit 100 adjusts the frequency of clock signals $S_{QCLK}$ and $S_{DCLK}$ in response to an adjustment of the frequency of encoded clock signal $S_{ECLK}$ because, as mentioned above, the frequency of a signal is related to its period (T) by the well-known relation f=1/T. More information regarding adjusting the periods of clock signals $S_{QCLK}$ and $S_{DCLK}$ in response to an adjustment of the period of encoded clock signal $S_{ECLK}$ is provided below with FIGS. 6, 7 and 8.

The duty cycle of clock signals $S_{QCLK}$ and $S_{DCLK}$ are related to the period of encoded clock signal $S_{ECLK}$. The duty cycle of a signal can be defined in many different ways. For the signals discussed herein, the duty cycle is defined as the ratio of the duration of the HI state of the signal to the corresponding local signal period. In other situations, the duty cycle is defined as the ratio of the duration of the LO state of the signal to the corresponding local signal period. In FIG. 2, clock signals $S_{QCLK}$ and $S_{DCLK}$ each have a 50% duty cycle because clock signals $S_{QCLK}$ and $S_{DCLK}$ each have HI and LO states with durations of T/2, and the corresponding local signal period is T.

Figure 3:
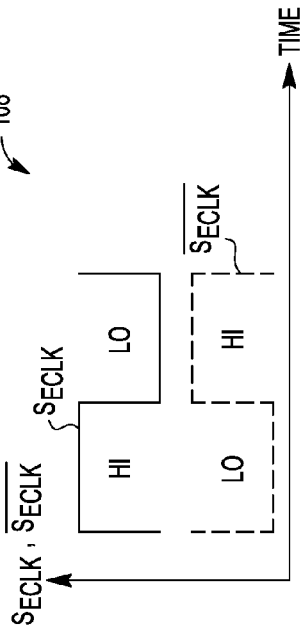
FIGS. 3 and 4 are graphs of other examples of clock signal $S_{QCLK}$, wherein clock signal $S_{QCLK}$ is provided by the clock conditioning circuit of FIG. 1.
Figure 4:
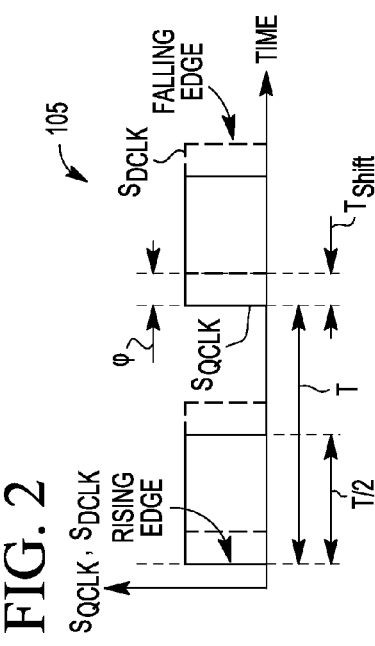

FIGS. 3 and 4 are graphs 106 and 107, respectively, of another example of clock signal $S_{QCLK}$ verses time. In FIG. 3, clock signal $S_{QCLK}$ has a duty cycle that is greater than 50% because its HI state has a duration greater than T/2 and its LO state has a duration less than T/2. In FIG. 4, clock signal $S_{QCLK}$ has a duty cycle that is less than 50% because its HI state has a duration less than T/2 and its LO state has a duration greater than T/2.

Clock conditioning circuit 100 adjusts the duty cycle of clock signals $S_{QCLK}$ and $S_{DCLK}$ in response to a change in the local period of encoded clock signal $S_{ECLK}$. The change in the local period of encoded clock signal $S_{ECLK}$ is a time-varying change, wherein the duration of each adjacent local period $T_{ECLKA}$ and $T_{ECLKB}$ of encoded clock signal $S_{ECLK}$ is different. As mentioned above, a signal with a time varying period has adjacent local periods having HI and LO states with different durations. More information regarding an encoded clock signal $S_{ECLK}$ with a non time-varying period is provided below with FIGS. 6, 7 and 8. More information regarding an encoded clock signal $S_{ECLK}$ with a time-varying period is provided below with FIGS. 9 and 10.

Figure 9:
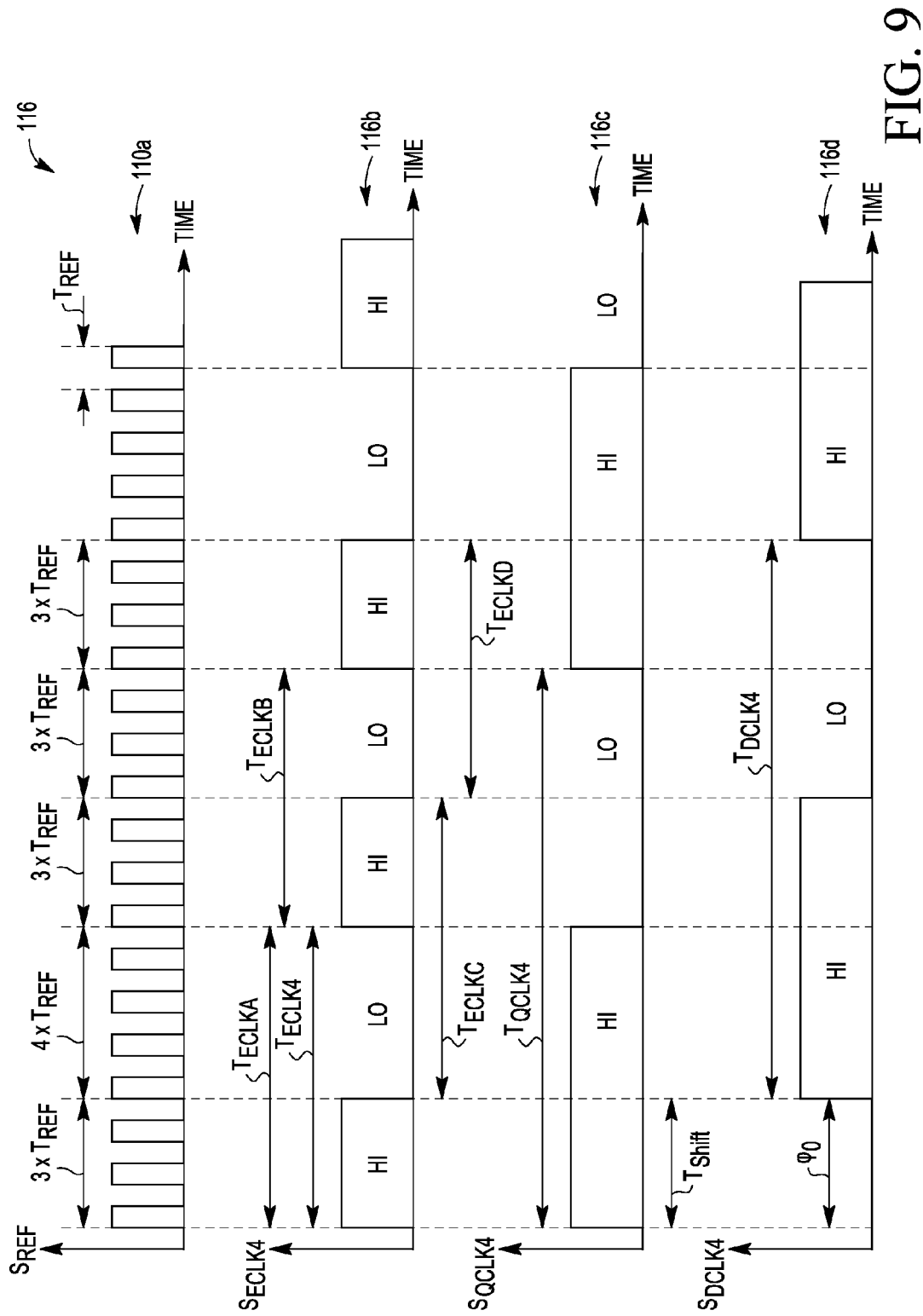
FIGS. 9 and 10 show timing diagrams having graphs, which illustrate that the duty cycles of clock signals $S_{QCLK}$ and $S_{DCLK}$ can be adjusted by clock conditioning circuit of FIG. 1 in response to receiving encoded clock signal $S_{ECLK}$.

Clock conditioning circuit 100 increases the duty cycle of clock signal $S_{QCLK}$ in response to an increase in the ratio of local periods $T_{ECLKA}$ to $T_{ECLKB}$ (i.e. $T_{ECLKA}/T_{ECLKB}$ increases), as discussed in more detail with FIG. 9. Further, clock conditioning circuit 100 decreases the duty cycle of clock signal $S_{QCLK}$ in response to a decrease in the ratio of local periods $T_{ECLKA}$ to $T_{ECLKB}$ (i.e. $T_{ECLKA}/T_{ECLKB}$ decreases), as discussed in more detail with FIG. 10.

It should be noted that a symmetric signal has a duty cycle that is equal to 50%, and an asymmetric signal has a duty cycle that is not equal to 50%. Hence, clock conditioning circuit 100 adjusts the symmetry of clock signals $S_{QCLK}$ and $S_{DCLK}$ in response to an adjustment of the local period of encoded clock signal $S_{ECLK}$. For example, the symmetry of clock signal $S_{QCLK}$ can be changed from being symmetric to asymmetric in response to increasing and decreasing the difference between local periods $T_{ECLKA}$ and $T_{ECLKB}$. Further, the symmetry of clock signal $S_{QCLK}$ can be changed from being asymmetric to symmetric in response to driving the difference between local periods $T_{ECLKA}$ and $T_{ECLKB}$ to zero.

As discussed in more detail below, local periods $T_{ECLKA}$ and $T_{ECLKB}$ are generally changed by increments equal to period $T_{REF}$ of reference clock signal $S_{REF}$.

Figure 5:
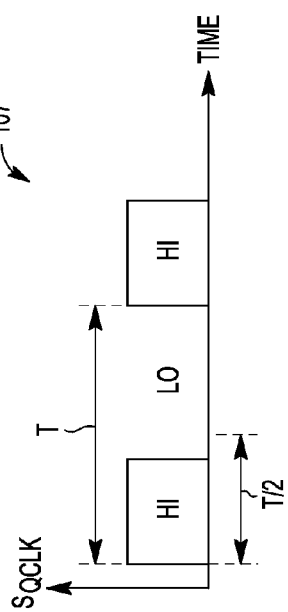
FIG. 5 is a graph of a complementary encoded clock signal $\overline{S_{ECLK}}$, which has the opposite polarity of the encoded clock signal $S_{ECLK}$ of FIG. 1.

FIG. 5 is a graph 108 of complementary encoded clock signal $\overline{S_{ECLK}}$, which has the opposite polarity of encoded clock signal $S_{ECLK}$. Complementary encoded clock signal $\overline{S_{ECLK}}$ has the opposite polarity of encoded clock signal $S_{ECLK}$ because encoded clock signal $\overline{S_{ECLK}}$ has its HI state when encoded clock signal $S_{ECLK}$ has its LO state, and encoded clock signal $\overline{S_{ECLK}}$ has its LO state when encoded clock signal $S_{QCLK}$ has its HI state. Complementary encoded clock signal $\overline{S_{ECLK}}$ has the opposite polarity of encoded clock signal $S_{ECLK}$ because encoded clock signal $\overline{S_{ECLK}}$ has a rising edge when encoded clock signal $S_{ECLK}$ has a falling edge, and encoded clock signal $\overline{S_{ECLK}}$ has a falling edge when encoded clock signal $S_{ECLK}$ has a rising edge. It should be noted that complementary encoded clock signal $\overline{S_{ECLK}}$ can be provided by providing encoded clock signal $S_{ECLK}$ to the input of an inverter, as discussed in more detail with FIGS. 11 and 12.

Clock conditioning circuit 100 can be responsive to the rising or falling edges of the digital signal. However, in this embodiment, clock conditioning circuit 100 is responsive to a rising edge of a digital signal. Hence, it is useful to provide complementary encoded clock signal $\overline{S_{ECLK}}$ when it is desirable to have clock conditioning circuit 100 respond to a falling edge of encoded clock signal $S_{ECLK}$, such as when providing clock signal $S_{DCLK}$. Providing clock signal $S_{DCLK}$ in response to a falling edge of encoded clock signal $S_{ECLK}$ will be discussed in more detail with FIGS. 6, 7 and 8, as well as FIGS. 9 and 10.

The phase difference between clock signals $S_{QCLK}$ and $S_{DCLK}$ is shown in FIG. 2. In FIG. 2, clock signals $S_{QCLK}$ and $S_{DCLK}$ each have period T, and the phase difference between clock signals $S_{QCLK}$ and $S_{DCLK}$ is denoted as φ. The phase of clock signals $S_{QCLK}$ and $S_{DCLK}$ is typically determined relative to a reference clock signal, such as reference clock signal $S_{REF}$.

In general, the phase difference between clock signals $S_{QCLK}$ and $S_{DCLK}$ is related to the duration of the HI state of encoded clock signal $S_{ECLK}$. The phase difference between clock signals $S_{QCLK}$ and $S_{DCLK}$ is adjusted by clock conditioning circuit 100 in response to an adjustment of the duration of the HI state of encoded clock signal $S_{ECLK}$. For example, clock conditioning circuit 100 increases the phase difference between clock signals $S_{QCLK}$ and $S_{DCLK}$ in response to an increase in the duration of the HI state of encoded clock signal $S_{ECLK}$. Further, clock conditioning circuit 100 decreases the phase difference between clock signals $S_{QCLK}$ and $S_{DCLK}$ in response to a decrease in the duration of the HI state of encoded clock signal $S_{ECLK}$. Clock conditioning circuit 100 adjusts the phase of clock signal $S_{DCLK}$ in response to a change in the phase of clock signal $S_{QCLK}$ relative to the reference clock signal.

It should be noted that, in some situations, the phase difference between clock signals $S_{QCLK}$ and $S_{DCLK}$ is adjusted by clock conditioning circuit 100 in response to an adjustment of the duration of the LO state of encoded clock signal $S_{ECLK}$. In these situations, the clock conditioning circuit is responsive to the falling edge of the digital signal so that the phase difference between clock signals $S_{QCLK}$ and $S_{DCLK}$ is adjusted in response to an adjustment of the duration of the LO state of encoded clock signal $S_{ECLK}$. However, as mentioned above, the clock conditioning circuits discussed herein are responsive to the rising edge of the digital signal so that the phase difference between clock signals $S_{QCLK}$ and $S_{DCLK}$ is adjusted in response to an adjustment of the duration of the HI state of encoded clock signal $S_{ECLK}$.

It should also be noted that the phase difference φ between two signals corresponds to a time difference between them. For example, in FIG. 2, clock signal $S_{DCLK}$ is shifted by a time $T_{Shift}$ relative to clock signal $S_{QCLK}$. Hence, clock conditioning circuit 100 adjusts time $T_{Shift}$ between clock signals $S_{QCLK}$ and $S_{DCLK}$. Clock conditioning circuit 100 adjusts time $T_{Shift}$ by delaying clock signal $S_{DCLK}$ to drive the phase difference between clock signals $S_{QCLK}$ and $S_{DCLK}$ to a desired phase difference $\phi_{Desired}$. Some examples of signals $S_{REF}$, $S_{ECLK}$, $S_{QCLK}$, $S_{DCLK}$ and $S_{SYNC}$, as well as their relationship with one another, will be discussed in more detail presently.

Figure 6:
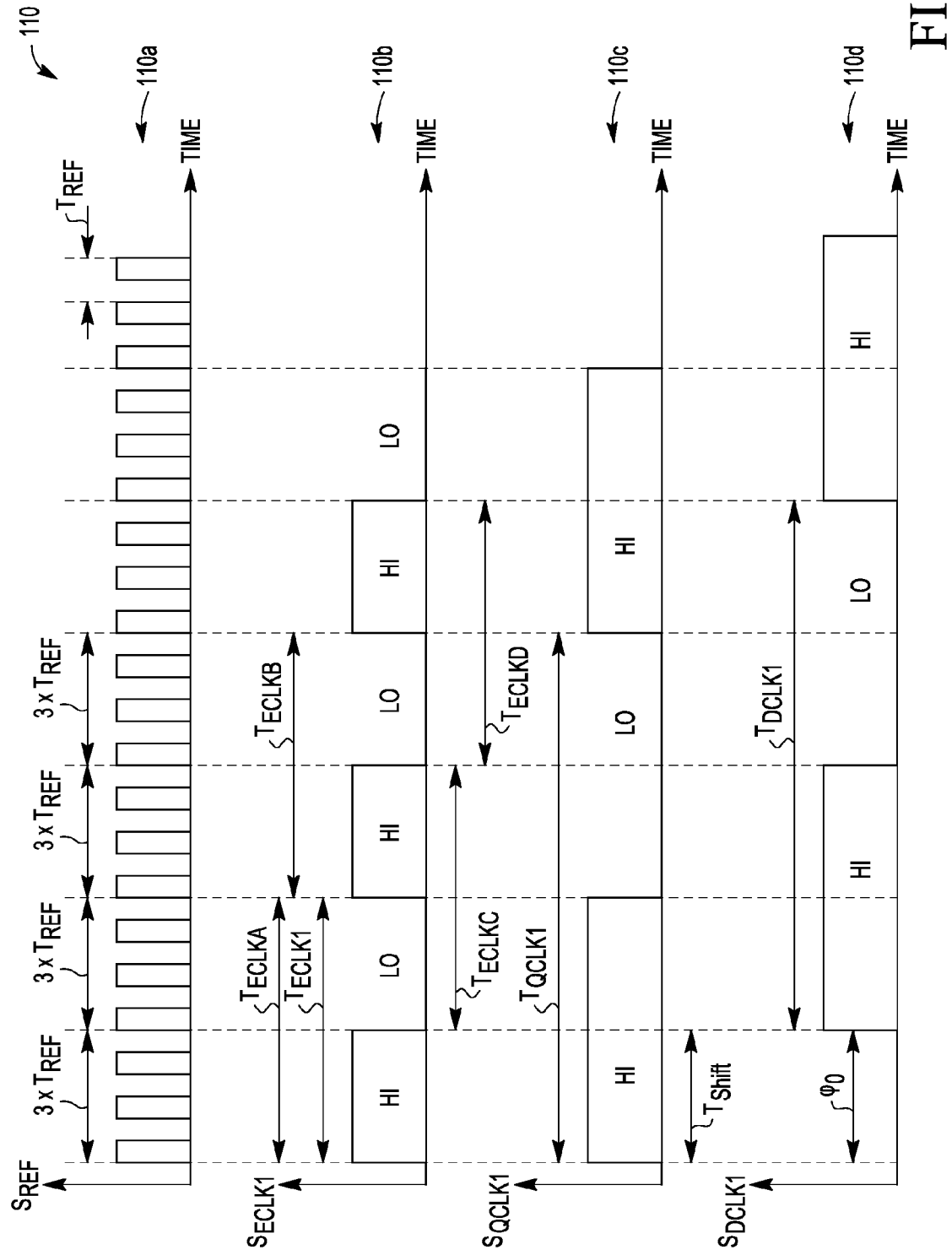
FIGS. 6, 7 and 8 show timing diagrams having graphs, which illustrate that the period of and phase difference between clock signals $S_{QCLK}$ and $S_{DCLK}$ can be adjusted by clock conditioning circuit of FIG. 1 in response to receiving encoded clock signal $S_{ECLK}$.

FIG. 6 shows a timing diagram 110 having graphs 110a, 110b, 110c and 110d. Graph 110a shows reference clock signal $S_{REF}$ verses time, wherein reference clock signal $S_{REF}$ is periodic with period $T_{REF}$ and frequency $f_{REF}$. Reference clock signal $S_{REF}$ is a digital signal which has one HI state and one LO state per reference clock period $T_{REF}$. Reference clock signal $S_{REF}$ has one rising edge and one falling edge per reference clock period $T_{REF}$. Hence, reference clock signal $S_{REF}$ alternates between HI and LO states. Reference clock signal $S_{REF}$ can have many different frequencies. For example, in some signal processing systems, frequency $f_{REF}$ is 1248 MHZ or 1456 MHZ. However, frequency $f_{REF}$ can have other frequency values, if desired.

Graph 110b shows one example of encoded clock signal $S_{ECLK1}$, wherein encoded clock signal $S_{ECLK1}$ is periodic with a local period $T_{ECLK1}$ and frequency $f_{ECLK1}$. In this embodiment, encoded clock signal $S_{ECLK1}$ is a digital signal which has one HI state and one LO state per encoded clock period $T_{ECLK1}$. Encoded clock signal $S_{ECLK1}$ has one rising edge and one falling edge per reference clock period $T_{ECLK1}$. Hence, encoded clock signal $S_{ECLK1}$ alternates between HI and LO states.

The duration of the HI and LO states of encoded clock signal $S_{ECLK1}$ correspond to a predetermined number of periods of reference clock signal $S_{REF}$. For example, in graph 110b, the HI state of encoded clock signal $S_{ECLK1}$ corresponds to three periods of reference clock signal $S_{REF}$ because the HI state of encoded clock signal $S_{ECLK1}$ has a duration of $3 \times T_{REF}$. Further, the LO state of encoded clock signal $S_{ECLK1}$ corresponds to three periods of reference clock signal $S_{REF}$ because the LO state of encoded clock signal $S_{ECLK}$ has a duration of $3 \times T_{REF}$. In this way, encoded clock signal $S_{ECLK1}$ is related to reference clock signal $S_{REF}$. It should be noted that the period $T_{ECLK1}$ of encoded clock signal $S_{ECLK1}$ is $6 \times T_{REF}$ because, as mentioned above, encoded clock signal $S_{ECLK1}$ has one HI state and one LO state per encoded clock period $T_{ECLK1}$.

It should also be noted that, in graph 110b, encoded clock signal $S_{ECLK1}$ is symmetric because its HI and LO states have the same number of periods of reference clock signal $S_{REF}$. The HI and LO states of encoded clock signal $S_{ECLK1}$ of graph 110b correspond to the same number of periods of reference clock signal $S_{REF}$ because, as mentioned above, the duration of the HI state is $3 \times T_{REF}$ and the duration of the LO state is $3 \times T_{REF}$.

Encoded clock signal $S_{ECLK1}$ has a non time-varying period because local period $T_{ECLK1}$ does not vary as a function of time. For example, as shown in graph 110b, encoded clock signal $S_{ECLK1}$ has HI and LO states with a duration of $T_{ECKLA}$, and HI and LO states with a duration of $T_{ECLKB}$. Further, the LO state of period $T_{ECKLA}$ and the HI state of period $T_{ECLKB}$ have a duration of $T_{ECLKC}$. The LO state of period $T_{ECLKB}$ and the HI state of the next period have a duration of $T_{ECLKD}$. Encoded clock signal $S_{ECLK1}$ has a non time-varying period because local periods $T_{ECLKA}$, $T_{ECLKB}$, $T_{ECLKC}$ and $T_{ECLKD}$ are equal to each other. It should be noted that local periods $T_{ECLKA}$, $T_{ECLKB}$, $T_{ECLKC}$ and $T_{ECLKD}$ are each equal to local period $T_{ECLK1}$ for encoded clock signal $S_{ECLK1}$. It should also be noted that the global period of encoded clock signal $S_{ECLK1}$ is equal to its local period $T_{ECLK1}$.

Graphs 110c and 110d show clock signals $S_{QCLK1}$ and $S_{DCLK1}$, respectively, which are provided by clock conditioning system 100 (FIG. 1) in response to receiving encoded clock signal $S_{ECLK1}$. The HI and LO states of clock signals $S_{QCLK1}$ and $S_{DCLK1}$ correspond to the HI and LO states of encoded clock signal $S_{ECLK1}$. For example, the HI state of clock signal $S_{QCLK1}$ corresponds with local period $T_{ECLKA}$ of encoded clock signal $S_{ECLK1}$. As mentioned above, local period $T_{ECLKA}$ of encoded clock signal $S_{ECLK1}$ is $6 \times T_{REF}$. Hence, the HI state of clock signal $S_{QCLK1}$ has a duration of $6 \times T_{REF}$.

Further, the LO state of clock signal $S_{QCLK1}$ corresponds with local period $T_{ECLKB}$ of encoded clock signal $S_{ECLK1}$. As mentioned above, local period $T_{ECLKB}$ of encoded clock signal $S_{ECLK1}$ is $6 \times T_{REF}$. Hence, the LO state of clock signal $S_{QCLK1}$ has a duration of $6 \times T_{REF}$, and the period of clock signal $S_{QCLK1}$ is $12 \times T_{REF}$. In this way, the HI and LO states of clock signals $S_{QCLK}$ corresponds to the HI and LO states of encoded clock signal $S_{ECLK1}$, and clock signal $S_{QCLK1}$ is related to reference clock signal $S_{REF}$ by encoded clock signal $S_{ECLK1}$.

It should be noted that, in graph 110c, clock signal $S_{QCLK1}$ is symmetric because its HI and LO states correspond to the same number of periods of reference clock signal $S_{REF}$. Further, clock signal $S_{QCLK1}$ has a 50% duty cycle because its HI and LO states correspond to the same number of periods of reference clock signal $S_{REF}$. The HI and LO states of clock signal $S_{QCLK1}$ correspond to the same number of periods of reference clock signal $S_{REF}$ because, as mentioned above, the duration of the HI state is $6 \times T_{REF}$ and the duration of the LO state is $6 \times T_{REF}$.

In graph 110d, the HI state of clock signal $S_{DCLK1}$ corresponds with local period $T_{ECLKC}$ of encoded clock signal $S_{ECLK1}$. As mentioned above, local period $T_{ECLKC}$ of encoded clock signal $S_{ECLK1}$ is $6 \times T_{REF}$. Hence, the HI state of clock signal $S_{DCLK1}$ has a duration of $6 \times T_{REF}$.

Further, the LO state of clock signal $S_{DCLK1}$ corresponds with local period $T_{ECLKD}$ of encoded clock signal $S_{ECLK1}$. As mentioned above, local period $T_{ECLKD}$ of encoded clock signal $S_{ECLK1}$ is $6 \times T_{REF}$. Hence, the LO state of clock signal $S_{DCLK1}$ has a duration of $6 \times T_{REF}$, and the period of clock signal $S_{DCLK1}$ is $12 \times T_{REF}$. In this way, the HI and LO states of clock signals $S_{DCLK1}$ corresponds to the HI and LO states of encoded clock signal $S_{ECLK1}$, and clock signal $S_{DCLK1}$ is related to reference clock signal $S_{REF}$ by encoded clock signal $S_{ECLK1}$.

It should be noted that, in graph 110d, clock signal $S_{DCLK1}$ is symmetric because its HI and LO states correspond to the same number of periods of reference clock signal $S_{REF}$. Further, clock signal $S_{DCLK1}$ has a 50% duty cycle because its HI and LO states correspond to the same number of periods of reference clock signal $S_{REF}$. The HI and LO states of clock signal $S_{DCLK1}$ correspond to the same number of periods of reference clock signal $S_{REF}$ because, as mentioned above, the duration of the HI state is $6 \times T_{REF}$ and the duration of the LO state is $6 \times T_{REF}$.

It should also be noted that clock signals $S_{QCLK1}$ and $S_{DCLK1}$ are phase shifted relative to each other so that the phase difference $\phi$ is non-zero. The phase difference $\phi$ between clock signals $S_{QCLK1}$ and $S_{DCLK1}$ corresponds with time shift $T_{Shift}$, as shown in FIG. 2. In this example, the value of time shift $T_{Shift}$ corresponds with encoded clock signal $S_{ECLK1}$ because, as mentioned above, $T_{Shift}$ corresponds with the HI state of encoded clock signal $S_{ECLK1}$. Time shift $T_{Shift}$ corresponds with the HI state of encoded clock signal $S_{ECLK1}$ because $T_{Shift}$ is equal to $3 \times T_{REF}$ and the HI state of encoded clock signal $S_{ECLK1}$ corresponds with $3 \times T_{REF}$. The phase difference between clock signals $S_{QCLK1}$ and $S_{DCLK1}$ of FIG. 6 is 90° because encoded clock signal $S_{ECLK1}$ has a period of $6 \times T_{REF}$ and period $T_{Shift}$ is equal to $3 \times T_{REF}$, which is one-quarter of the local period of clock signals $S_{QCLK1}$ and $S_{DCLK1}$.

As mentioned above, the periods of clock signals $S_{QCLK}$ and $S_{DCLK}$ are related to the period of reference clock signal $S_{REF}$ by encoded clock signal $S_{ECLK}$. The periods of clock signals $S_{QCLK}$ and $S_{DCLK}$ are related to the period of reference clock signal $S_{REF}$ by encoded clock signal $S_{ECLK}$ because clock conditioning circuit 100 adjusts the periods of clock signals $S_{QCLK}$ and $S_{DCLK}$ in response to an adjustment of the period of encoded clock signal $S_{ECLK}$. For example, clock conditioning circuit 100 increases the local periods of clock signals $S_{QCLK}$ and $S_{DCLK}$ in response to increasing the local period of encoded clock signal $S_{ECLK}$, as will be discussed with FIG. 7. Further, clock conditioning circuit 100 decreases the local periods of clock signals $S_{QCLK}$ and $S_{DCLK}$ in response to decreasing the local period of encoded clock signal $S_{ECLK}$, as will be discussed with FIG. 8.

Figure 7:
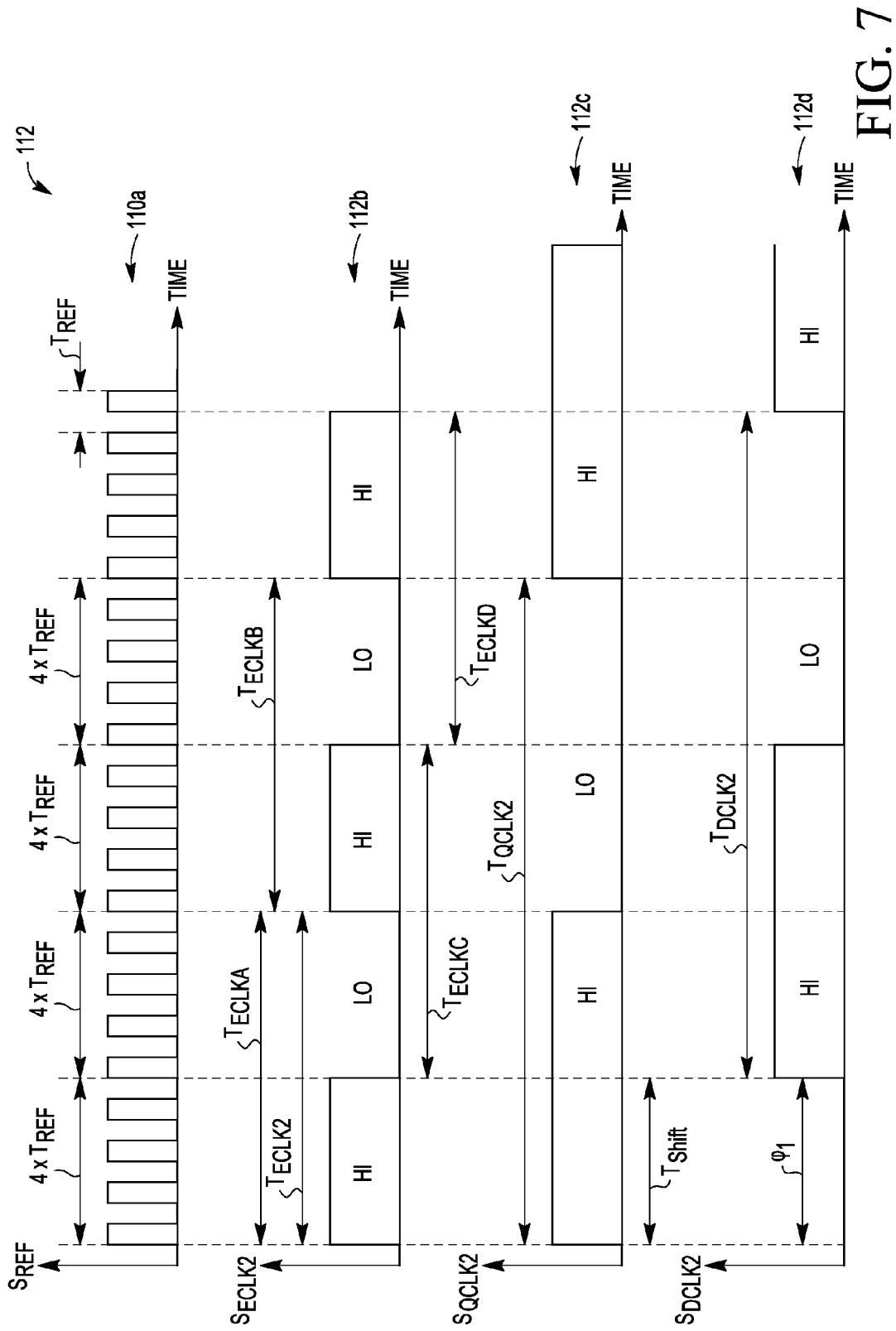

FIG. 7 shows a timing diagram 112 having graphs 110a, 112b, 112c and 112d, which illustrate that the local periods of clock signals $S_{QCLK2}$ and $S_{DCLK2}$ are increased by clock conditioning circuit 100 in response to an increase of the local period of encoded clock signal $S_{ECLK1}$ of graph 110b. Graph 112b shows an encoded clock signal $S_{ECLK2}$, wherein encoded clock signal $S_{ECLK2}$ is periodic with a local period $T_{ECLK2}$ and frequency $f_{ECLK2}$. In graph 112b, the HI state of encoded clock signal $S_{ECLK2}$ corresponds to four periods of reference clock signal $S_{REF}$ because the HI state of encoded clock signal $S_{ECLK2}$ has a duration of $4 \times T_{REF}$. Further, the LO state of encoded clock signal $S_{ECLK2}$ corresponds to four periods of reference clock signal $S_{REF}$ because the LO state of encoded clock signal $S_{ECLK2}$ has a duration of $4 \times T_{REF}$. In this way, encoded clock signal $S_{ECLK}$ is related to reference clock signal $S_{REF}$. It should be noted that the local period of encoded clock signal $S_{ECLK2}$ is $8 \times T_{REF}$ because, as mentioned above, encoded clock signal $S_{ECLK2}$ has one HI state and one LO state per encoded clock period $T_{ECLK}$. Hence, encoded clock signal $S_{ECLK2}$ has a period that is larger than encoded clock signal $S_{ECLK1}$ because period $T_{ECLK2}$ is larger than $T_{ECLK1}$.

It should also be noted that, in graph 112b, encoded clock signal $S_{ECLK2}$ is symmetric because its HI and LO states have the same number of periods of reference clock signal $S_{REF}$. The HI and LO states of encoded clock signal $S_{ECLK2}$ correspond to the same number of periods of reference clock signal $S_{REF}$ because, as mentioned above, the duration of the HI state is $4 \times T_{REF}$ and the duration of the LO state is $4 \times T_{REF}$.

Encoded clock signal $S_{ECLK2}$ has a non time-varying period because local period $T_{ECLK2}$ does not vary as a function of time. For example, as shown in graph 112b, encoded clock signal $S_{ECLK2}$ has HI and LO states with a duration of $T_{ECKLA}$, and HI and LO states with a duration of $T_{ECKLB}$. Further, the LO state of period $T_{ECKLA}$ and the HI state of period $T_{ECKLB}$ have a duration of $T_{ECLKC}$. The LO state of period $T_{ECKLB}$ and the HI state of the next period have a duration of $T_{ECLKD}$. Encoded clock signal $S_{ECLK2}$ has a non time-varying period because local periods $T_{ECLKA}$, $T_{ECLKB}$, $T_{ECLKC}$ and $T_{ECLKD}$ are equal to each other. It should be noted that local periods $T_{ECLKA}$, $T_{ECLKB}$, $T_{ECLKC}$ and $T_{ECLKD}$ are each equal to local period $T_{ECLK2}$ for encoded clock signal $S_{ECLK2}$. It should also be noted that the global period of encoded clock signal $S_{ECLK2}$ is equal to its local period $T_{ECLK2}$.

Graphs 112c and 112d show clock signals $S_{QCLK2}$ and $S_{DCLK2}$, respectively, which are provided by clock conditioning system 100 (FIG. 1) in response to receiving encoded clock signal $S_{ECLK2}$. The HI and LO states of clock signals $S_{QCLK2}$ and $S_{DCLK2}$ correspond to the HI and LO states of encoded clock signal $S_{ECLK2}$. For example, the HI state of clock signal $S_{QCLK2}$ corresponds with local period $T_{ECLKA}$ of encoded clock signal $S_{ECLK2}$. As mentioned above, local period $T_{ECLKA}$ of encoded clock signal $S_{ECLK2}$ is $8 \times T_{REF}$. Hence, the HI state of clock signal $S_{QCLK2}$ has a duration of $8 \times T_{REF}$.

Further, the LO state of clock signal $S_{QCLK2}$ corresponds with local period $T_{ECLKB}$ of encoded clock signal $S_{ECLK2}$. As mentioned above, local period $T_{ECLKB}$ of encoded clock signal $S_{ECLK2}$ is $8 \times T_{REF}$. The LO state of clock signal $S_{QCLK2}$ has a duration of $8 \times T_{REF}$, and the period of clock signal $S_{QCLK2}$ is $16 \times T_{REF}$. Hence, the HI and LO states of clock signals $S_{QCLK2}$ corresponds to the HI and LO states of encoded clock signal $S_{ECLK2}$, and clock signal $S_{QCLK2}$ is related to reference clock signal $S_{REF}$. In this way, the period of clock signal $S_{QCLK}$ is increased by clock conditioning circuit 100 in response to an increase of the local period of encoded clock signal $S_{ECLK}$.

It should be noted that, in graph 112c, clock signal $S_{QCLK2}$ is symmetric because its HI and LO states correspond to the same number of periods of reference clock signal $S_{REF}$. Further, clock signal $S_{QCLK2}$ has a 50% duty cycle because its HI and LO states correspond to the same number of periods of reference clock signal $S_{REF}$. The HI and LO states of clock signal $S_{QCLK2}$ correspond to the same number of periods of reference clock signal $S_{REF}$ because, as mentioned above, the duration of the HI state is $8 \times T_{REF}$ and the duration of the LO state is $8 \times T_{REF}$.

In graph 112d, the HI state of clock signal $S_{DCLK2}$ corresponds with local period $T_{ECLKC}$ of encoded clock signal $S_{ECLK2}$. As mentioned above, local period $T_{ECLKC}$ of encoded clock signal $S_{ECLK2}$ is $8 \times T_{REF}$. Hence, the HI state of clock signal $S_{DCLK2}$ has a duration of $8 \times T_{REF}$.

Further, the LO state of clock signal $S_{DCLK2}$ corresponds with local period $T_{ECLKD}$ of encoded clock signal $S_{ECLK2}$. As mentioned above, local period $T_{ECLKD}$ of encoded clock signal $S_{ECLK2}$ is $8 \times T_{REF}$. The LO state of clock signal $S_{DCLK2}$ has a duration of $8 \times T_{REF}$, and the period of clock signal $S_{DCLK2}$ is $16 \times T_{REF}$. Hence, the HI and LO states of clock signals $S_{DCLK2}$ corresponds to the HI and LO states of encoded clock signal $S_{ECLK2}$, and clock signal $S_{DCLK2}$ is related to reference clock signal $S_{REF}$. In this way, the period of clock signal $S_{DCLK}$ is increased by clock conditioning circuit 100 in response to an increase of the local period of encoded clock signal $S_{ECLK}$.

It should be noted that, in graph 112d, clock signal $S_{DCLK2}$ is symmetric because its HI and LO states correspond to the same number of periods of encoded clock signal $S_{ECLK2}$. Further, clock signal $S_{DCLK2}$ has a 50% duty cycle because its HI and LO states correspond to the same number of periods of reference clock signal $S_{REF}$. The HI and LO states of clock signal $S_{DCLK2}$ correspond to the same number of periods of reference clock signal $S_{REF}$ because, as mentioned above, the duration of the HI state is $8 \times T_{REF}$ and the duration of the LO state is $8 \times T_{REF}$.

Figure 8:
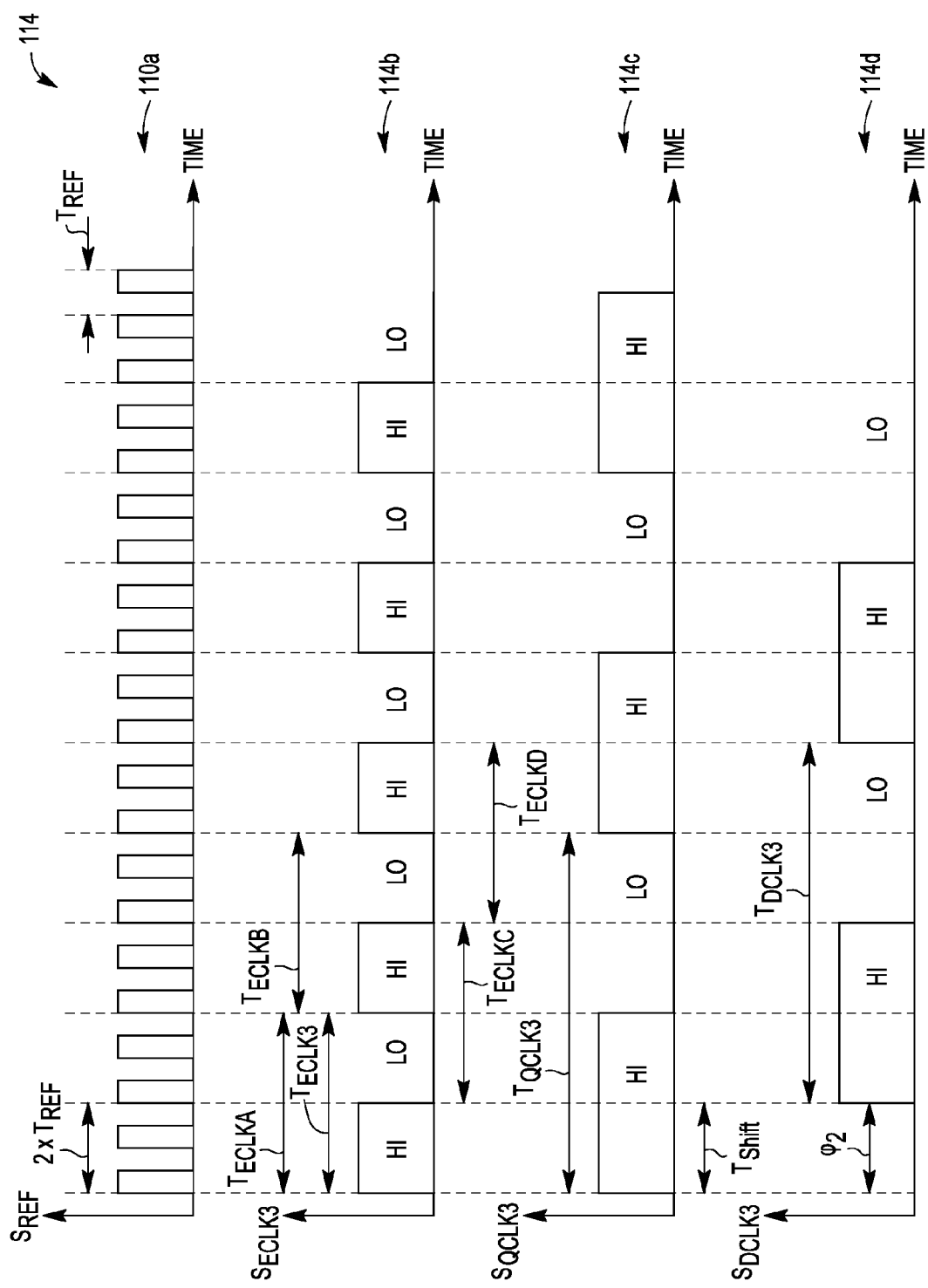

FIG. 8 shows a timing diagram 114 having graphs 110a, 114b, 114c and 114d, which illustrate that the local periods of clock signals $S_{QCLK}$ and $S_{DCLK}$ are decreased by clock conditioning circuit 100 in response to a decrease of the local period of encoded clock signal $S_{ECLK}$. Graph 114b shows an encoded clock signal $S_{ECLK3}$, wherein encoded clock signal $S_{ECLK3}$ is periodic with a local period $T_{ECLK3}$ and frequency $f_{ECLK3}$. In graph 114b, the HI state of encoded clock signal $S_{ECLK3}$ corresponds to two periods of reference clock signal $S_{REF}$ because the HI state of encoded clock signal $S_{ECLK3}$ has a duration of $2 \times T_{REF}$. Further, the LO state of encoded clock signal $S_{ECLK3}$ corresponds to two periods of reference clock signal $S_{REF}$ because the LO state of encoded clock signal $S_{ECLK3}$ has a duration of $2 \times T_{REF}$. In this way, encoded clock signal $S_{ECLK3}$ is related to reference clock signal $S_{REF}$. It should be noted that the local period of encoded clock signal $S_{ECLK3}$ is $4 \times T_{REF}$ because, as mentioned above, encoded clock signal $S_{ECLK3}$ has one HI state and one LO state per encoded clock period $T_{ECLK3}$.

It should also be noted that, in graph 114b, encoded clock signal $S_{ECLK3}$ is symmetric because its HI and LO states have the same number of periods of reference clock signal $S_{REF}$. The HI and LO states of encoded clock signal $S_{ECLK3}$ of graph 114b correspond to the same number of periods of reference clock signal $S_{REF}$ because, as mentioned above, the duration of the HI state is $2 \times T_{REF}$ and the duration of the LO state is $2 \times T_{REF}$.

Encoded clock signal $S_{ECLK3}$ has a non time-varying period because local period $T_{ECLK3}$ does not vary as a function of time. For example, as shown in graph 114b, encoded clock signal $S_{ECLK3}$ has HI and LO states with a duration of period $T_{ECKLA}$, and HI and LO states with a duration of period $T_{ECLKB}$. Further, the LO state of period $T_{ECKLA}$ and the HI state of period $T_{ECLKB}$ have a duration of $T_{ECLKC}$. The LO state of period $T_{ECKLB}$ and the HI state of the next period have a duration of $T_{ECLKD}$. Encoded clock signal $S_{ECLK3}$ has a non time-varying period because local periods $T_{ECLKA}$, $T_{ECLKB}$, $T_{ECLKC}$ and $T_{ECLKD}$ are equal to each other. It should be noted that local periods $T_{ECLKA}$, $T_{ECLKB}$, $T_{ECLKC}$ and $T_{ECLKD}$ are each equal to local period $T_{ECLK3}$ for encoded clock signal $S_{ECLK3}$. It should also be noted that the global period of encoded clock signal $S_{ECLK3}$ is equal to its local period $T_{ECLK3}$.

Graphs 114c and 114d show clock signals $S_{QCLK3}$ and $S_{DCLK3}$, respectively, which are provided by clock conditioning system 100 (FIG. 1) in response to receiving encoded clock signal $S_{ECLK3}$. The HI and LO states of clock signals $S_{QCLK3}$ and $S_{DCLK3}$ correspond to the HI and LO states of encoded clock signal $S_{ECLK3}$. For example, the HI state of clock signal $S_{QCLK3}$ corresponds with local period $T_{ECLKA}$ of encoded clock signal $S_{ECLK3}$. As mentioned above, local period $T_{ECLKA}$ of encoded clock signal $S_{ECLK3}$ is $4 \times T_{REF}$. Hence, the HI state of clock signal $S_{QCLK3}$ has a duration of $4 \times T_{REF}$.

Further, the LO state of clock signal $S_{QCLK3}$ corresponds with local period $T_{ECLKB}$ of encoded clock signal $S_{ECLK3}$. As mentioned above, local period $T_{ECLKB}$ of encoded clock signal $S_{ECLK3}$ is $4 \times T_{REF}$. The LO state of clock signal $S_{QCLK3}$ has a duration of $4 \times T_{REF}$, and the period of clock signal $S_{QCLK3}$ is $8 \times T_{REF}$. Hence, the HI and LO states of clock signals $S_{QCLK3}$ corresponds to the HI and LO states of encoded clock signal $S_{ECLK3}$, and clock signal $S_{QCLK3}$ is related to reference clock signal $S_{REF}$. In this way, the period of clock signal $S_{QCLK}$ is decreased by clock conditioning circuit 100 in response to a decrease of the period of encoded clock signal $S_{ECLK}$.

It should be noted that, in graph 114c, clock signal $S_{QCLK3}$ is symmetric because its HI and LO states correspond to the same number of periods of reference clock signal $S_{REF}$. Further, clock signal $S_{QCLK3}$ has a 50% duty cycle because its HI and LO states correspond to the same number of periods of reference clock signal $S_{REF}$. The HI and LO states of clock signal $S_{QCLK3}$ correspond to the same number of periods of reference clock signal $S_{REF}$ because, as mentioned above, the duration of the HI state is $4 \times T_{REF}$ and the duration of the LO state is $4 \times T_{REF}$.

In graph 114d, the HI state of clock signal $S_{DCLK3}$ corresponds with local period $T_{ECLKC}$ of encoded clock signal $S_{ECLK3}$. As mentioned above, local period $T_{ECLKC}$ of encoded clock signal $S_{ECLK3}$ is $4 \times T_{REF}$. Hence, the HI state of clock signal $S_{DCLK3}$ has a duration of $4 \times T_{REF}$.

Further, the LO state of clock signal $S_{DCLK3}$ corresponds with local period $T_{ECLKD}$ of encoded clock signal $S_{ECLK3}$. As mentioned above, local period $T_{ECLKD}$ of encoded clock signal $S_{ECLK3}$ is $4 \times T_{REF}$. The LO state of clock signal $S_{DCLK3}$ has a duration of $4 \times T_{REF}$, and the period of clock signal $S_{DCLK3}$ is $8 \times T_{REF}$. Hence, the HI and LO states of clock signals $S_{DCLK3}$ corresponds to the HI and LO states of encoded clock signal $S_{ECLK3}$, and clock signal $S_{DCLK3}$ is related to reference clock signal $S_{REF}$. In this way, the local period of clock signal $S_{DCLK}$ is decreased by clock conditioning circuit 100 in response to a decrease of the local period of encoded clock signal $S_{ECLK}$.

It should be noted that, in graph 114d, clock signal $S_{DCLK3}$ is symmetric because its HI and LO states correspond to the same number of periods of encoded clock signal $S_{ECLK3}$. Further, clock signal $S_{DCLK3}$ has a 50% duty cycle because its HI and LO states correspond to the same number of periods of reference clock signal $S_{REF}$. The HI and LO states of clock signal $S_{DCLK3}$ correspond to the same number of periods of reference clock signal $S_{REF}$ because, as mentioned above, the duration of the HI state is $4 \times T_{REF}$ and the duration of the LO state is $4 \times T_{REF}$.

Thus, FIGS. 6, 7 and 8 illustrate that the local periods of clock signals $S_{QCLK}$ and $S_{DCLK}$ can be increased and decreased by clock conditioning circuit 100 in response to an increase and decrease, respectively, of the local period of encoded clock signal $S_{ECLK}$. In this way, encoded clock signal $S_{ECLK}$ is encoded with information regarding the period of clock signals $S_{QCLK}$ and $S_{DCLK}$.

As mentioned above, the phase difference between clock signals $S_{QCLK}$ and $S_{DCLK}$ is related to the duration of the HI state of encoded clock signal $S_{ECLK}$. The phase difference between clock signals $S_{QCLK}$ and $S_{DCLK}$ is adjusted by clock conditioning circuit 100 in response to an adjustment of the duration of the HI state of encoded clock signal $S_{ECLK}$. The adjustment of the duration of the HI state of encoded clock signal $S_{ECLK}$ corresponds with an adjustment of time $T_{Shift}$ between clock signals $S_{QCLK}$ and $S_{DCLK}$. The phase difference $\phi$ between two signals corresponds to a time difference between them, as discussed in more detail with FIG. 2.

For example, in FIG. 6, the duration of the HI state of encoded clock signal $S_{ECLK1}$ is $3 \times T_{REF}$, so that the value of time $T_{Shift}$ is $3 \times T_{REF}$. In FIG. 7, the duration of the HI state of encoded clock signal $S_{ECLK2}$ is $4 \times T_{REF}$, so that the value of time $T_{Shift}$ is $4 \times T_{REF}$. Further, in FIG. 8, the duration of the HI state of encoded clock signal $S_{ECLK3}$ is $2 \times T_{REF}$, so that the value of time $T_{Shift}$ is $2 \times T_{REF}$. Hence, the phase difference between clock signals $S_{QCLK}$ and $S_{DCLK}$ is adjusted by clock conditioning circuit 100 in response to an adjustment of the duration of the HI state of encoded clock signal $S_{ECLK}$. In this way, encoded clock signal $S_{ECLK}$ is encoded with information regarding the phase difference between clock signals $S_{QCLK}$ and $S_{DCLK}$. It should be noted that, for asymmetric clock signals, the phase difference between clock signals $S_{QCLK}$ and $S_{DCLK}$ is related to the duration of the HI state of encoded clock signal $S_{ECLK}$ during period $T_{ECLKA}$. Although, in some situations, the phase difference between clock signals $S_{QCLK}$ and $S_{DCLK}$ can be related to the duration of the LO state of encoded clock signal $S_{ECLK}$ during period $T_{ECLKA}$.

As mentioned above, the duty cycle of clock signals $S_{QCLK}$ and $S_{DCLK}$ are related to the local period of encoded clock signal $S_{ECLK}$. The duty cycle of clock signals $S_{QCLK}$ and $S_{DCLK}$ are related to the period of reference clock signal $S_{REF}$ by encoded clock signal $S_{ECLK}$ because clock conditioning circuit 100 adjusts the duty cycles of clock signals $S_{QCLK}$ and $S_{DCLK}$ in response to an adjustment of the local period of encoded clock signal $S_{ECLK}$. For example, the duty cycle of clock signal $S_{QCLK}$ is increased by clock conditioning circuit 100 in response to an increase of the ratio of local period $T_{ECLKA}$ to $T_{ECLKB}$ (i.e. $T_{ECLKA}/T_{ECLKB}$ increases), as will be discussed with FIG. 9. Further, the duty cycle of clock signal $S_{QCLK}$ is decreased by clock conditioning circuit 100 in response to a decrease of the ratio of local period $T_{ECLKA}$ to $T_{ECLKB}$ (i.e. $T_{ECLKA}/T_{ECLKB}$ decreases), as will be discussed with FIG. 10.

FIG. 9 shows a timing diagram 116 having graphs 110a, 116b, 116c and 116d, which illustrate that the duty cycles of clock signals $S_{QCLK}$ and $S_{DCLK}$ are increased by clock conditioning circuit 100 in response to an increase of the ratio of local period $T_{ECLKA}$ to $T_{ECLKB}$ and local period $T_{ECLKC}$ to $T_{ECLKD}$, respectively. Graph 116b shows an encoded clock signal $S_{ECLK4}$, wherein encoded clock signal $S_{ECLK4}$ is periodic with a local period $T_{ECLK4}$ that varies between local periods $T_{ECLKA}$ and $T_{ECLKB}$, and between local periods $T_{ECLKC}$ and $T_{ECLKD}$. Hence, encoded clock signal $S_{ECLK4}$ has a time varying local period, wherein local period $T_{ECLK4}$ varies as a function of time. It should be noted that the global period of encoded clock signal $S_{ECLK4}$ is equal to the sum of local periods $T_{ECLKA}$ and $T_{ECLKB}$. Further, the global period of encoded clock signal $S_{ECLK4}$ is equal to the sum of local periods $T_{ECLKC}$ and $T_{ECLKD}$.

The HI state of encoded clock signal $S_{ECLK4}$ corresponds to three periods of reference clock signal $S_{REF}$ in period $T_{ECLKA}$ because the HI state of encoded clock signal $S_{ECLK4}$ in period $T_{ECLKA}$ has a duration of $3 \times T_{REF}$. Further, the LO state of encoded clock signal $S_{ECLK4}$ corresponds to four periods of reference clock signal $S_{REF}$ in period $T_{ECLKA}$ because the LO state of encoded clock signal $S_{ECLK4}$ in period $T_{ECLKA}$ has a duration of $4 \times T_{REF}$. It should be noted that local period $T_{ECLKA}$ of encoded clock signal $S_{ECLK4}$ has a duration of $7 \times T_{REF}$.

In graph 116b, the HI state of encoded clock signal $S_{ECLK4}$ corresponds to three periods of reference clock signal $S_{REF}$ in period $T_{ECLKB}$ because the HI state of encoded clock signal $S_{ECLK4}$ in period $T_{ECLKB}$ has a duration of $3 \times T_{REF}$. Further, the LO state of encoded clock signal $S_{ECLK4}$ corresponds to three periods of reference clock signal $S_{REF}$ in period $T_{ECLKB}$ because the LO state of encoded clock signal $S_{ECLK4}$ in period $T_{ECLKB}$ has a duration of $3 \times T_{REF}$. It should be noted that local period $T_{ECLKB}$ of encoded clock signal $S_{ECLK4}$ has a duration of $6 \times T_{REF}$.

In graph 116b, encoded clock signal $S_{ECLK4}$ is asymmetric in local period $T_{ECLKA}$ because its HI and LO states have different numbers of periods of reference clock signal $S_{REF}$. The HI and LO states of encoded clock signal $S_{ECLK4}$ correspond to a different number of periods of reference clock signal $S_{REF}$ because, as mentioned above, the duration of the HI state of local period $T_{ECLKA}$ is $3 \times T_{REF}$ and the duration of the LO state of local period $T_{ECLKA}$ is $4 \times T_{REF}$.

Further, in graph 116b, encoded clock signal $S_{ECLK4}$ is symmetric in local period $T_{ECLKB}$ because its HI and LO states have the same number of periods of reference clock signal $S_{REF}$. The HI and LO states of encoded clock signal $S_{ECLK4}$ correspond to the same number of periods of reference clock signal $S_{REF}$ because, as mentioned above, the duration of the HI state of local period $T_{ECLKB}$ is $3 \times T_{REF}$ and the duration of the LO state of local period $T_{ECLKB}$ is $3 \times T_{REF}$. Hence, encoded clock signal $S_{ECLK4}$ alternates between being asymmetric during local period $T_{ECLKA}$ and symmetric during local period $T_{ECLKB}$. In this way, encoded clock signal $S_{ECLK4}$ has time varying local periods $T_{ECLKA}$ and $T_{ECLKB}$, wherein the duration of the HI and LO states vary from one period to another. The duration of the HI and LO states change from one local period to an adjacent local period so that the symmetry of encoded clock signal $S_{ECLK4}$ changes from the one local period to the adjacent local period.

In graph 116b, encoded clock signal $S_{ECLK4}$ has local period $T_{ECLKC}$, which includes the LO state of local period $T_{ECLKA}$ and the HI state of local period $T_{ECLKB}$. In this example, local period $T_{ECLKC}$ is equal to $T_{ECLKA}$, so that local period $T_{ECLK4}$ does not vary between local periods $T_{ECLKA}$ and $T_{ECLKC}$. Further, local period $T_{ECLKC}$ is not equal to $T_{ECLKB}$, so that local period $T_{ECLK4}$ varies between local periods $T_{ECLKB}$ and $T_{ECLKC}$. As discussed in more detail below, local period $T_{ECLKC}$ corresponds with a HI state of clock signal $S_{DCLK}$.

In graph 116b, encoded clock signal $S_{ECLK4}$ has local period $T_{ECLKD}$, which includes the LO state of local period $T_{ECLKB}$ and the HI state of the adjacent local period. In this example, local period $T_{ECLKD}$ is equal to $T_{ECLKB}$, so that local period $T_{ECLK4}$ does not vary between local periods $T_{ECLKB}$ and $T_{ECLKD}$. Further, local period $T_{ECLKD}$ is not equal to $T_{ECLKA}$, so that local period $T_{ECLK4}$ varies between local periods $T_{ECLKA}$ and $T_{ECLKD}$. As discussed in more detail below, local period $T_{ECLKD}$ corresponds with a LO state of clock signal $S_{DCLK}$.

Graphs 116c and 116d show clock signals $S_{QCLK4}$ and $S_{DCLK4}$, respectively, which are provided by clock conditioning system 100 (FIG. 1) in response to receiving encoded clock signal $S_{ECLK4}$. The HI and LO states of clock signals $S_{QCLK4}$ and $S_{DCLK4}$ correspond to the HI and LO states of encoded clock signal $S_{ECLK4}$. For example, the HI state of clock signal $S_{QCLK4}$ corresponds with local period $T_{ECLKA}$ of encoded clock signal $S_{ECLK4}$. As mentioned above, local period $T_{ECLKA}$ of encoded clock signal $S_{ECLK4}$ is $7 \times T_{REF}$. Hence, the HI state of clock signal $S_{QCLK4}$ has a duration of $7 \times T_{REF}$.

Further, the LO state of clock signal $S_{QCLK4}$ corresponds with local period $T_{ECLKB}$ of encoded clock signal $S_{ECLK4}$. As mentioned above, local period $T_{ECLKB}$ of encoded clock signal $S_{ECLK4}$ is $6 \times T_{REF}$. Hence, the LO state of clock signal $S_{QCLK4}$ has a duration of $6 \times T_{REF}$, and local period $T_{QCLK4}$ of clock signal $S_{QCLK4}$ is $13 \times T_{REF}$. In this way, the HI and LO states of clock signals $S_{QCLK4}$ corresponds to the HI and LO states of encoded clock signal $S_{ECLK4}$, and clock signal $S_{QCLK4}$ is related to reference clock signal $S_{REF}$ by encoded clock signal $S_{ECLK4}$.

It should be noted that, in graph 116c, clock signal $S_{QCLK4}$ is asymmetric because its HI and LO states correspond to a different number of periods of reference clock signal $S_{REF}$. Further, clock signal $S_{QCLK4}$ has a duty cycle that is greater than 50% because its HI state corresponds to a larger number of reference clock periods $T_{REF}$ than its LO state. The HI state of clock signal $S_{QCLK4}$ corresponds to a larger number of periods of reference clock signal $S_{REF}$ because, as mentioned above, the duration of the HI state is $7 \times T_{REF}$ and the duration of the LO state is $6 \times T_{REF}$. In this particular example, the duty cycle of clock signal $S_{QCLK4}$ is 7/13, which corresponds to a duty cycle of about 53.8%.

In graph 116d, the HI state of clock signal $S_{DCLK4}$ corresponds with local period $T_{ECLKC}$ of encoded clock signal $S_{ECLK4}$. As mentioned above, local period $T_{ECLKC}$ of encoded clock signal $S_{ECLK4}$ is equal to local period $T_{ECLKA}$, and local period $T_{ECLKA}$ is $7 \times T_{REF}$. Hence, the HI state of clock signal $S_{DCLK4}$ has a duration of $7 \times T_{REF}$.

Further, the LO state of clock signal $S_{DCLK4}$ corresponds with local period $T_{ECLKD}$ of encoded clock signal $S_{ECLK4}$. As mentioned above, local period $T_{ECLKD}$ of encoded clock signal $S_{ECLK4}$ is $6 \times T_{REF}$. Hence, the LO state of clock signal $S_{DCLK4}$ has a duration of $6 \times T_{REF}$, and the period of clock signal $S_{DCLK4}$ is $13 \times T_{REF}$. In this way, the HI and LO states of clock signal $S_{DCLK4}$ corresponds to the HI and LO states of encoded clock signal $S_{ECLK4}$, and clock signal $S_{DCLK4}$ is related to reference clock signal $S_{REF}$ by encoded clock signal $S_{ECLK4}$.

It should be noted that, in graph 116d, clock signal $S_{DCLK4}$ is asymmetric because its HI and LO states correspond to a different number of periods of reference clock signal $S_{REF}$. Further, clock signal $S_{DCLK4}$ has a duty cycle that is greater than 50% because its HI state corresponds to a larger number of reference clock periods $T_{REF}$ than its LO state. The HI state of clock signal $S_{DCLK4}$ corresponds to a larger number of periods of reference clock signal $S_{REF}$ because, as mentioned above, the duration of the HI state is $7 \times T_{REF}$ and the duration of the LO state is $6 \times T_{REF}$. In this particular example, the duty cycle of clock signal $S_{DCLK4}$ is 7/13, which corresponds to a duty cycle of about 53.8%.

Figure 10:
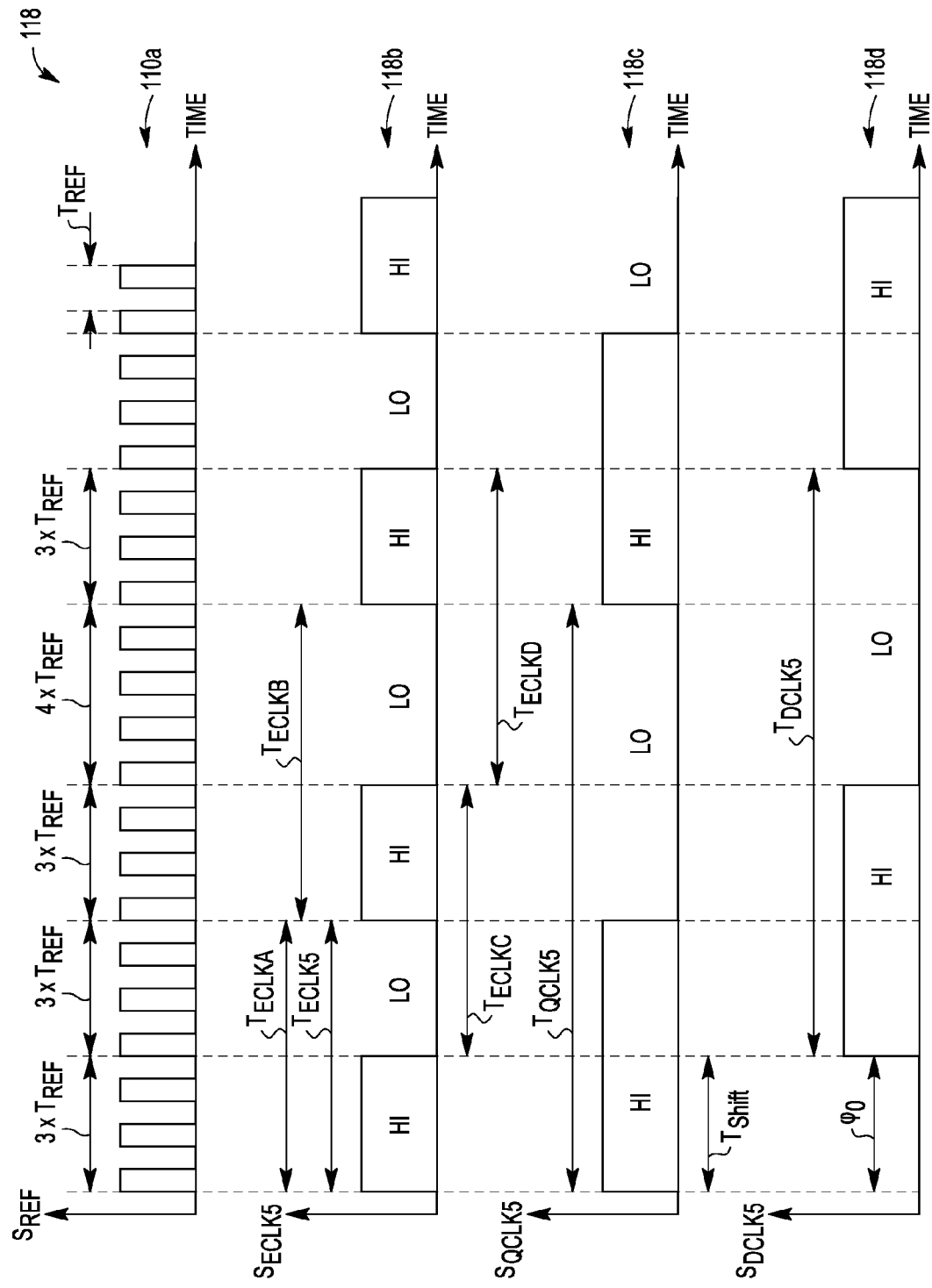

FIG. 10 shows a timing diagram 118 having graphs 110a, 118b, 118c and 118d, which illustrate that the duty cycles of clock signals $S_{QCLK}$ and $S_{DCLK}$ are decreased by clock conditioning circuit 100 in response to a decrease of the ratio of local period $T_{ECLKA}$ to $T_{ECLKB}$ and local period $T_{ECLKC}$ to $T_{ECLKD}$, respectively. Graph 118b shows an encoded clock signal $S_{ECLK5}$, wherein encoded clock signal $S_{ECLK5}$ is periodic with a local period $T_{ECLK5}$ that varies between periods $T_{ECLKA}$ to $T_{ECLKB}$, and between periods $T_{ECLKC}$ to $T_{ECLKD}$. Hence, encoded clock signal $S_{ECLK5}$ has a time varying local period, wherein local period $T_{ECLK5}$ varies as a function of time. It should be noted that the global period of encoded clock signal $S_{ECLK5}$ is equal to the sum of local periods $T_{ECLKA}$ and $T_{ECLKB}$. Further, the global period of encoded clock signal $S_{ECLK5}$ is equal to the sum of local periods $T_{ECLKC}$ and $T_{ECLKD}$.

The HI state of encoded clock signal $S_{ECLK5}$ corresponds to three periods of reference clock signal $S_{REF}$ in period $T_{ECLKA}$ because the HI state of encoded clock signal $S_{ECLK5}$ in period $T_{ECLKA}$ has a duration of $3 \times T_{REF}$. Further, the LO state of encoded clock signal $S_{ECLK5}$ corresponds to three periods of reference clock signal $S_{REF}$ in period $T_{ECLKB}$ because the LO state of encoded clock signal $S_{ECLK5}$ in period $T_{ECLKA}$ has a duration of $3 \times T_{REF}$. It should be noted that local period $T_{ECLKA}$ of encoded clock signal $S_{ECLK5}$ is $6 \times T_{REF}$.

In graph 118b, the HI state of encoded clock signal $S_{ECLK5}$ corresponds to three periods of reference clock signal $S_{REF}$ in period $T_{ECLKB}$ because the HI state of encoded clock signal $S_{ECLK5}$ in period $T_{ECLKB}$ has a duration of $3 \times T_{REF}$. Further, the LO state of encoded clock signal $S_{ECLK5}$ corresponds to four periods of reference clock signal $S_{REF}$ in period $T_{ECLKB}$ because the LO state of encoded clock signal $S_{ECLK5}$ in period $T_{ECLKB}$ has a duration of $4 \times T_{REF}$. It should be noted that local period $T_{ECLKB}$ encoded clock signal $S_{ECLK5}$ has a duration of $7 \times T_{REF}$.

In graph 118b, encoded clock signal $S_{ECLK5}$ is symmetric in local period $T_{ECLKA}$ because its HI and LO states have the same number of periods of reference clock signal $S_{REF}$. The HI and LO states of encoded clock signal $S_{ECLK5}$ correspond to the same number of periods of reference clock signal $S_{REF}$ because, as mentioned above, the duration of the HI state of local period $T_{ECLKA}$ is $3 \times T_{REF}$ and the duration of the LO state of local period $T_{ECLKA}$ is $3 \times T_{REF}$.

Further, in graph 118b, encoded clock signal $S_{ECLKB}$ is asymmetric in local period $T_{ECLKB}$ because its HI and LO states have a different number of periods of reference clock signal $S_{REF}$. The HI and LO states of encoded clock signal $S_{ECLK5}$ have a different number of periods of reference clock signal $S_{REF}$ because, as mentioned above, the duration of the HI state of local period $T_{ECLKB}$ is $3 \times T_{REF}$ and the duration of the LO state of local period $T_{ECLKB}$ is $4 \times T_{REF}$. Hence, encoded clock signal $S_{ECLK5}$ alternates between being symmetric during local period $T_{ECLKA}$ and asymmetric during local period $T_{ECLKB}$. In this way, encoded clock signal $S_{ECLK5}$ has time varying local periods $T_{ECLKA}$ and $T_{ECLKB}$, wherein the duration of the HI and LO states vary from one period to another. The duration of the HI and LO states change from one local period to an adjacent local period so that the symmetry of encoded clock signal $S_{ECLK5}$ changes from the one local period to the adjacent local period.

In graph 118b, encoded clock signal $S_{ECLK5}$ has local period $T_{ECLKC}$, which includes the LO state of local period $T_{ECLKA}$ and the HI state of local period $T_{ECLKB}$. In this example, local period $T_{ECLKC}$ is equal to local period $T_{ECLKA}$, so local that period $T_{ECLK5}$ does not vary between local periods $T_{ECLKA}$ and $T_{ECLKC}$. Further, local period $T_{ECLKC}$ is not equal to $T_{ECLKB}$, so that local period $T_{ECLK5}$ varies between local periods $T_{ECLKB}$ and $T_{ECLKC}$. As discussed in more detail below, local period $T_{ECLKC}$ corresponds with a HI state of clock signal $S_{DCLK}$.

In graph 118b, encoded clock signal $S_{ECLK5}$ has local period $T_{ECLKD}$, which includes the LO state of local period $T_{ECLKB}$ and the HI state of the adjacent local period. In this example, local period $T_{ECLKD}$ is equal to local period $T_{ECLKB}$, so that local period $T_{ECLK5}$ does not vary between local periods $T_{ECLKB}$ and $T_{ECLKD}$. Further, local period $T_{ECLKD}$ is not equal to local period $T_{ECLKA}$, so that local period $T_{ECLK5}$ varies between local periods $T_{ECLKA}$ and $T_{ECLKD}$. As discussed in more detail below, local period $T_{ECLKD}$ corresponds with a LO state of clock signal $S_{DCLK}$.

Graphs 118c and 118d show clock signals $S_{QCLK5}$ and $S_{DCLK5}$, respectively, which are provided by clock conditioning system 100 (FIG. 1) in response to receiving encoded clock signal $S_{ECLK5}$. The HI and LO states of clock signals $S_{QCLK5}$ and $S_{DCLK5}$ correspond to the HI and LO states of encoded clock signal $S_{ECLK5}$. For example, the HI state of clock signal $S_{QCLK5}$ corresponds with local period $T_{ECLKA}$ of encoded clock signal $S_{ECLK5}$. As mentioned above, local period $T_{ECLKA}$ of encoded clock signal $S_{ECLK5}$ is $6 \times T_{REF}$. Hence, the HI state of clock signal $S_{QCLK5}$ has a duration of $6 \times T_{REF}$.

Further, the LO state of clock signal $S_{QCLK5}$ corresponds with period $T_{ECLKB}$ of encoded clock signal $S_{ECLK5}$. As mentioned above, local period $T_{ECLKB}$ of encoded clock signal $S_{ECLK5}$ is $7 \times T_{REF}$. Hence, the LO state of clock signal $S_{QCLK5}$ has a duration of $7 \times T_{REF}$, and local period $T_{QCLK5}$ of clock signal $S_{QCLK5}$ is $13 \times T_{REF}$. In this way, the HI and LO states of clock signal $S_{QCLK5}$ corresponds to the HI and LO states of encoded clock signal $S_{ECLK5}$, and clock signal $S_{QCLK5}$ is related to reference clock signal $S_{REF}$ by encoded clock signal $S_{ECLK5}$.

It should be noted that, in graph 118c, clock signal $S_{QCLK5}$ is asymmetric because its HI and LO states correspond to a different number of periods of reference clock signal $S_{REF}$. Further, clock signal $S_{QCLK5}$ has a duty cycle that is less than 50% because its HI state corresponds to a smaller number of reference clock periods $T_{REF}$ than its LO state. The HI state of clock signal $S_{QCLK5}$ corresponds to a smaller number of periods of reference clock signal $S_{REF}$ because, as mentioned above, the duration of the HI state is $6 \times T_{REF}$ and the duration of the LO state is $7 \times T_{REF}$. In this particular example, the duty cycle of clock signal $S_{QCLK5}$ is 6/13, which corresponds to a duty cycle of about 46.2%.

In graph 118d, the HI state of clock signal $S_{DCLK5}$ corresponds with local period $T_{ECLKC}$ of encoded clock signal $S_{ECLK5}$. As mentioned above, local period $T_{ECLKC}$ of encoded clock signal $S_{ECLK5}$ is equal to local period $T_{ECLKA}$, and local period $T_{ECLKA}$ is $6 \times T_{REF}$. Hence, the HI state of clock signal $S_{DCLK5}$ has a duration of $6 \times T_{REF}$.

Further, the LO state of clock signal $S_{DCLK5}$ corresponds with local period $T_{ECLKD}$ of encoded clock signal $S_{ECLK5}$. As mentioned above, local period $T_{ECLKD}$ of encoded clock signal $S_{ECLK5}$ is $7 \times T_{REF}$. Hence, the LO state of clock signal $S_{DCLK5}$ has a duration of $7 \times T_{REF}$, and the period of clock signal $S_{DCLK5}$ is $13 \times T_{REF}$. In this way, the HI and LO states of clock signal $S_{DCLK5}$ corresponds to the HI and LO states of encoded clock signal $S_{ECLK5}$, and clock signal $S_{DCLK5}$ is related to reference clock signal $S_{REF}$ by encoded clock signal $S_{ECLK5}$.

It should be noted that, in graph 118d, clock signal $S_{DCLK5}$ is asymmetric because its HI and LO states correspond to a different number of periods of reference clock signal $S_{REF}$. Further, clock signal $S_{DCLK5}$ has a duty cycle that is less than 50% because its HI state corresponds to a smaller number of reference clock periods $T_{REF}$ than its LO state. The HI state of clock signal $S_{DCLK5}$ corresponds to a smaller number of periods of reference clock signal $S_{REF}$ because, as mentioned above, the duration of the HI state is $6 \times T_{REF}$ and the duration of the LO state is $7 \times T_{REF}$. In this particular example, the duty cycle of clock signal $S_{DCLK5}$ is 6/13, which corresponds to a duty cycle of about 46.2%.

Thus, clock conditioning circuit 100 adjusts the duty cycle of clock signals $S_{QCLK}$ and $S_{DCLK}$ in response to a change in a local period of encoded clock signal $S_{ECLK}$. The change in the period of encoded clock signal $S_{ECLK}$ is a time-varying change, wherein the duration of each adjacent local period $T_{ECLKA}$ and $T_{ECLKB}$ of encoded clock signal $S_{ECLK}$ changes so that the ratio of local periods $T_{ECLKA}$ to $T_{ECLKB}$ changes (i.e. $T_{ECLKA}/T_{ECLKB}$ changes).

Clock conditioning circuit 100 increases the duty cycle of clock signal $S_{QCLK}$ in response to an increase in the ratio of local period $T_{ECLKA}$ to $T_{ECLKB}$ (i.e. $T_{ECLKA}/T_{ECLKB}$ increases). Clock conditioning circuit 100 increases the duty cycle of clock signal $S_{DCLK}$ in response to an increase in the ratio of local period $T_{ECLKC}$ to $T_{ECLKD}$ (i.e. $T_{ECLKC}/T_{ECLKD}$ increases). For example, local periods $T_{ECLKA}$, $T_{ECLKB}$, $T_{ECLKC}$ and $T_{ECLKD}$ have durations of $6 \times T_{REF}$ for encoded clock signal $S_{ECLK1}$ of FIG. 6, so that clock signals $S_{QCLK1}$ and $S_{DCLK1}$ have a duty cycle of 50%. However, local periods $T_{ECLKA}$ and $T_{ECLKB}$ have durations of $7 \times T_{REF}$ and $6 \times T_{REF}$, respectively, for encoded clock signal $S_{ECLK4}$ of FIG. 9, so that clock signal $S_{QCLK4}$ has a duty cycle of 53.8%. Similarly, local periods $T_{ECLKC}$ and $T_{ECLKD}$ have durations of $7 \times T_{REF}$ and $6 \times T_{REF}$, respectively, for encoded clock signal $S_{ECLK4}$ of FIG. 9, so that clock signal $S_{DCLK4}$ has a duty cycle of 53.8%. Thus, FIGS. 6 and 9 illustrate that the duty cycles of clock signals $S_{QCLK}$ and $S_{DCLK}$ are increased by clock conditioning circuit 100 in response to an increase of the ratio of local period $T_{ECLKA}$ to $T_{ECLKB}$ and local period $T_{ECLKC}$ to $T_{ECLKD}$ of encoded clock signal $S_{ECLK}$.

Further, clock conditioning circuit 100 decreases the duty cycle of clock signals $S_{QCLK}$ and $S_{DCLK}$ in response to a decrease in the ratio of local period $T_{ECLKA}$ to $T_{ECLKB}$ (i.e. $T_{ECLKA}/T_{ECLKB}$ decreases) and local period $T_{ECLKC}$ to $T_{ECLKD}$ (i.e. $T_{ECLKC}/T_{ECLKD}$ decreases), as discussed in more detail with FIG. 10. For example, local periods $T_{ECLKA}$, $T_{ECLKB}$ $T_{ECLKC}$ and $T_{ECLKD}$ have durations of $6 \times T_{REF}$ for encoded clock signal $S_{ECLK1}$ of FIG. 6, so that clock signals $S_{QCLK1}$ and $S_{DCLK1}$ have a duty cycle of 50%. However, local periods $T_{ECLKA}$ and $T_{ECLKB}$ have durations of $6 \times T_{REF}$ and $7 \times T_{REF}$, respectively, for encoded clock signal $S_{ECLK5}$ of FIG. 10, so that clock signal $S_{QCLK5}$ has a duty cycle of 46.2%. Similarly, local periods $T_{ECLKC}$ and $T_{ECLKD}$ have durations of $6 \times T_{REF}$ and $7 \times T_{REF}$, respectively, for encoded clock signal $S_{ECLK5}$ of FIG. 10, so that clock signal $S_{DCLK5}$ has a duty cycle of 46.2%. Thus, FIGS. 6 and 10 illustrate that the duty cycles of clock signals $S_{QCLK}$ and $S_{DCLK}$ are decreased by clock conditioning circuit 100 in response to a decrease of the ratio of local period $T_{ECLKA}$ to $T_{ECLKB}$ and local period $T_{ECLKC}$ to $T_{ECLKD}$ of encoded clock signal $S_{ECLK}$. In this way, encoded clock signal $S_{ECLK}$ is encoded with information regarding the duty cycles of clock signals $S_{QCLK}$ and $S_{DCLK}$.

As mentioned above, for asymmetric clock signals, the phase difference between clock signals $S_{QCLK}$ and $S_{DCLK}$ is related to the duration of the HI state of encoded clock signal $S_{ECLK}$ during local period $T_{ECLKA}$. The phase difference between clock signals $S_{QCLK}$ and $S_{DCLK}$ is adjusted by clock conditioning circuit 100 in response to an adjustment of the duration of the HI state of encoded clock signal $S_{ECLK}$ during local period $T_{ECLKA}$. The adjustment of the duration of the HI state of encoded clock signal $S_{ECLK}$ during local period $T_{ECLKA}$ corresponds with an adjustment of a time $T_{Shift}$ between clock signals $S_{QCLK}$ and $S_{DCLK}$.

For example, in FIG. 9, the duration of the HI state of encoded clock signal $S_{ECLK4}$ is $3 \times T_{REF}$. Hence, the value of time $T_{Shift}$ is $3 \times T_{REF}$. If the duration of the HI state of encoded clock signal $S_{ECLK4}$ is $4 \times T_{REF}$, the value of time $T_{Shift}$ is $4 \times T_{REF}$. If the duration of the HI state of encoded clock signal $S_{ECLK4}$ is $2 \times T_{REF}$, the value of time $T_{Shift}$ is $2 \times T_{REF}$. In FIG. 10, the duration of the HI state of encoded clock signal $S_{ECLK5}$ is $3 \times T_{REF}$. Hence, the value of time $T_{Shift}$ is $3 \times T_{REF}$. If the duration of the HI state of encoded clock signal $S_{ECLK5}$ is $4 \times T_{REF}$, the value of time $T_{Shift}$ is $4 \times T_{REF}$. If the duration of the HI state of encoded clock signal $S_{ECLK5}$ is $2 \times T_{REF}$, the value of time $T_{Shift}$ is $2 \times T_{REF}$.

Hence, the phase difference between clock signals $S_{QCLK}$ and $S_{DCLK}$ is adjusted by clock conditioning circuit 100 in response to an adjustment of the duration of the HI state of encoded clock signal $S_{ECLK}$ during local period $T_{ECLKA}$. In this way, encoded clock signal $S_{ECLK}$ is encoded with information regarding the phase difference between clock signals $S_{QCLK}$ and $S_{DCLK}$.

Figure 11:
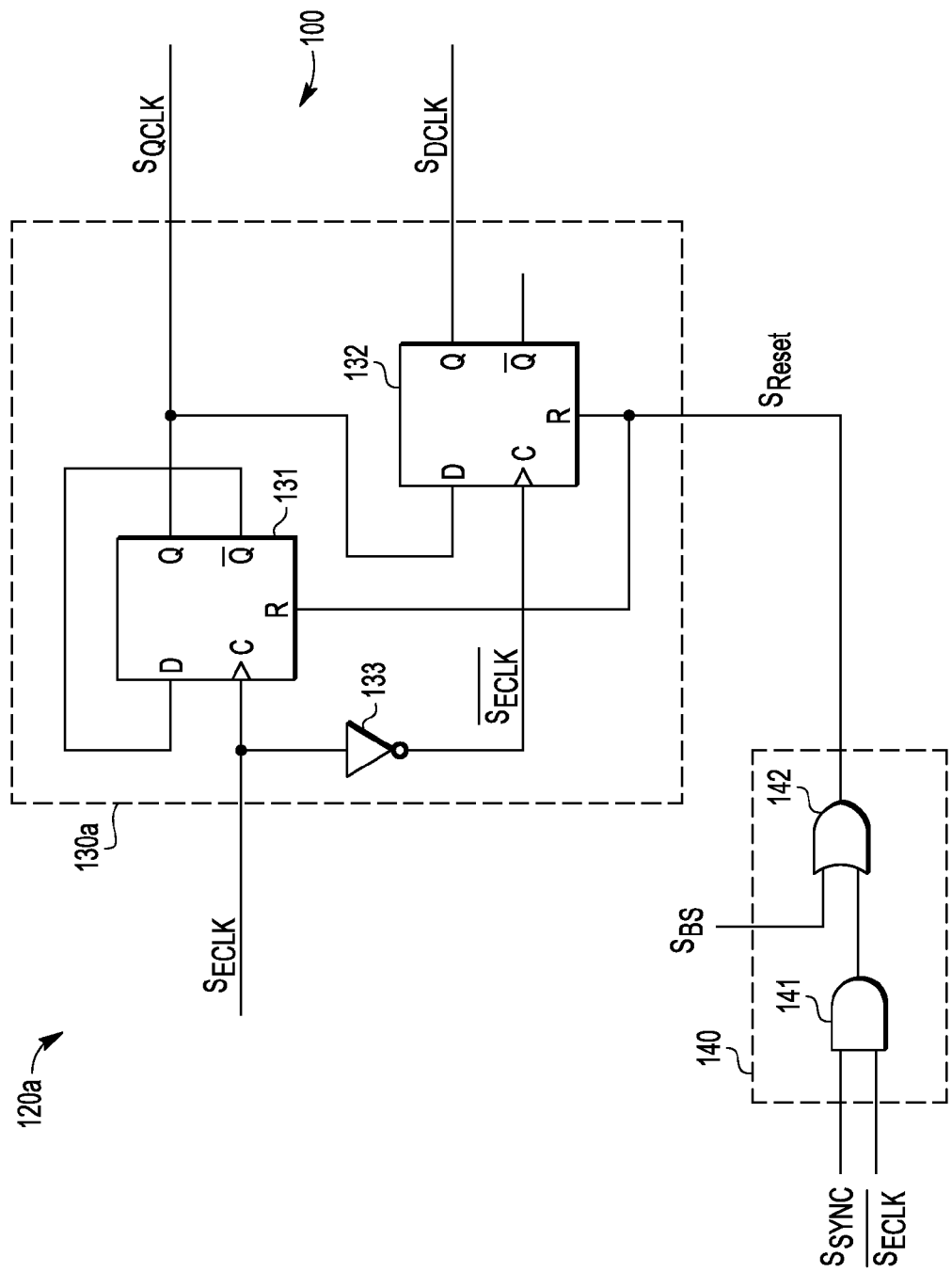
FIGS. 11 and 12 are circuit diagrams of embodiments of clock conditioning circuit of FIG. 1.

FIG. 11 is a circuit diagram 120a of one embodiment of clock conditioning circuit 100. In this embodiment, clock conditioning circuit 100 includes an encoding circuit 130a which includes D flip-flops 131 and 132. It should be noted that D flip-flops 131 and 132 are edge triggered D flip-flops. Further, D flip-flops 131 and 132 are triggered by the rising edge of a digital signal because, as mentioned above, clock conditioning circuit 100 is responsive to the rising edges of the digital signal. D flip-flops 131 and 132 are triggered by the falling edge of the digital signal in embodiments in which clock conditioning circuit 100 is responsive to the falling edges of the digital signal.

The clock input terminal of D flip-flop 131 receives encoded clock signal $S_{ECLK}$, and the clock input terminal of D flip-flop 132, receives encoded clock signal $S_{ECLK}$ through an output terminal of an inverter 133. In this way, D flip-flop 131 is clocked by encoded clock signal $S_{ECLK}$ and D flip-flop 132 is clocked by the complement of encoded clock signal $S_{ECLK}$, which is denoted as $\overline{S_{ECLK}}$. More information regarding clock signals $S_{ECLK}$ and $\overline{S_{ECLK}}$ is provided above with the discussion of FIG. 5. It should be noted that the clock inputs of D flip-flops 131 and 132 are denoted as C in circuit diagram 120a.

Data input terminal of D flip-flop 131 is connected to its $\overline{Q}$ output terminal, and its Q output terminal is connected to the data input terminal of D flip-flop 132. Data input terminals of D flip-flops 131 and 132 are denoted as D in circuit diagram 120a. The Q output terminal of D flip-flop 131 is connected to the data input terminal of D flip-flop 132 so that D flip-flop 131 drives the operation of D flip-flop 132. The Q output terminals of D flip-flops 131 and 132 provide clock signals $S_{QCLK}$ and $S_{DCLK}$, respectively. Some examples of encoded clock signal $S_{ECLK}$ and clock signals $S_{QCLK}$ and $S_{DCLK}$ are discussed in more detail above with FIGS. 6, 7, 8, 9 and 10.

In operation, D flip-flops 131 and 132 are connected together so that the periods of clock signals $S_{QCLK}$ and $S_{DCLK}$ are adjusted in response to receiving encoded clock signal $S_{ECLK}$ and complementary encoded clock signal $\overline{S_{ECLK}}$. Further, D flip-flops 131 and 132 are connected together so that the duty cycles of clock signals $S_{QCLK}$ and $S_{DCLK}$ are adjusted in response to receiving encoded clock signal $S_{ECLK}$ and complementary encoded clock signal $\overline{S_{ECLK}}$. D flip-flops 131 and 132 are connected together so that the phase difference between clock signals $S_{QCLK}$ and $S_{DCLK}$ is adjusted in response to receiving encoded clock signal $S_{ECLK}$ and complementary encoded clock signal $\overline{S_{ECLK}}$. In this way, encoded clock signal $S_{ECLK}$ is encoded with information regarding the period, duty cycle and phases of clock signals $S_{QCLK}$ and $S_{DCLK}$. More information regarding the adjustment of the period, duty cycle and phases of clock signals $S_{QCLK}$ and $S_{DCLK}$ is provided above with the discussion of FIGS. 6, 7, 8, 9 and 10.

In this embodiment, circuit 120a includes a synchronization circuit 140, which is connected to the reset terminals of D flip-flops 131 and 132. The reset terminals of D flip-flops 131 and 132 are denoted as R in circuit diagram 120a. As will be discussed in more detail with FIG. 13, synchronization circuit 140 provides a reset signal $S_{Reset}$ to the reset terminals of D flip-flops 131 and 132. Reset signal $S_{Reset}$ is a digital signal which resets D flip-flops 131 and 132 in response to reset signal $S_{Reset}$ transitioning from a LO state to a HI state. The Q outputs of D flip-flops 131 and 132 are driven to a predetermined value in response to reset signal $S_{Reset}$ transitioning between the LO and HI states. In some embodiments, the Q outputs of D flip-flops 131 and 132 are driven to the same value. In this embodiment, the Q outputs of D flip-flops 131 and 132 are driven to LO states. In other embodiments, the Q outputs of D flip-flops 131 and 132 are driven to HI states. In some embodiments, reset signal $S_{Reset}$ is a digital signal which resets D flip-flops 131 and 132 in response to reset signal $S_{Reset}$ transitioning from a HI state to a LO state.

In this embodiment, synchronization circuit 140 includes an AND gate 141 with an output terminal connected to an input terminal of an OR gate 142. One input terminal of AND gate 141 receives synchronization signal $S_{SYNC}$, and another input terminal of AND gate 141 receives signal $\overline{S_{ECLK}}$. It should be noted that, in some embodiments, signal $\overline{S_{ECLK}}$ is provided to the corresponding input terminal of AND gate 141 by the output terminal of inverter 133. The output terminal of OR gate 142 is connected to the reset terminals of D flip-flops 131 and 132.

Another input terminal of OR gate 142 operates as a battery save (BS) terminal, which powers down encoding circuit 130a in response to an indication from a battery save signal $S_{BS}$. It is desirable to power down encoding circuit 130a in many different situations, such as in a mobile application when clock conditioning circuit 100 is not being used. In mobile applications, it is desirable to conserve battery power.

D flip-flops 131 and 132 are not responsive to encoded clock signal $S_{ECLK}$ when the reset terminals receive a HI state of a signal. Further, D flip-flops 131 and 132 are responsive to encoded clock signal $S_{ECLK}$ when the reset terminals receive a LO state of a signal. The reset terminals of D flip-flops 131 and 132 receive a HI state of a signal in response to receiving a HI state of battery save signal $S_{BS}$. The reset terminals of D flip-flops 131 and 132 receive a LO state of a signal in response to receiving a LO state of battery save signal $S_{BS}$ and a LO state of AND gate 141. In this way, synchronization circuit 140 operates as a battery save circuit.

Synchronization circuit 140 adjusts the phase difference between clock signals $S_{QCLK}$ and $S_{DCLK}$. In the graphs of FIGS. 6, 7, 8, 9 and 10, the phase difference between clock signals $S_{QCLK}$ and $S_{DCLK}$ is such that clock signal $S_{QCLK}$ leads clock signal $S_{DCLK}$. It is desirable for clock signal $S_{QCLK}$ to lead clock signal $S_{DCLK}$ in situations in which clock signal $S_{QCLK}$ is used to drive a quantizer of a sigma-delta modulator and clock signal $S_{DCLK}$ is used to drive a DAC.

However, it should be appreciated that the phase difference between clock signals $S_{QCLK}$ and $S_{DCLK}$ is generally unknown at start-up when clock conditioning circuit 100 is turned on. For example, in some situations, clock signal $S_{QCLK}$ desirably leads clock signal $S_{DCLK}$ in response to turning on clock conditioning circuit 100 and, in other situations, clock signal $S_{QCLK}$ undesirably lags clock signal $S_{DCLK}$ in response to turning on clock conditioning circuit 100.

In situations in which clock signal $S_{QCLK}$ undesirably lags clock signal $S_{DCLK}$, synchronization circuit 140 ensures that clock signal $S_{QCLK}$ moves from a lagging state to a leading state after clock conditioning circuit 100 has been turned on. In this way, synchronization circuit 140 ensures that clock signal $S_{QCLK}$ desirably leads clock signal $S_{DCLK}$.

The phase difference between clock signals $S_{QCLK}$ and $S_{DCLK}$ can be undesirably changed in response to a change in the reference clock signal provided to the signal conditioning system. As mentioned above, in some signal processing systems, the available reference clock signals are at different frequencies, such as 1248 MHz and 1456 MHz. Hence, in some situations, the reference clock signal provided to the signal conditioning system is changed between reference clock signals having frequencies $f_{REF}$ of 1248 MHz and 1456 MHz. In some of these situations, clock signal $S_{QCLK}$ desirably leads clock signal $S_{DCLK}$ in response to changing between reference clock signals having frequencies $f_{REF}$ of 1248 MHz and 1456 MHz.

In other situations, clock signal $S_{QCLK}$ undesirably lags clock signal $S_{DCLK}$ in response to changing between reference clock signals having frequencies $f_{REF}$ of 1248 MHz and 1456 MHz. In situations in which clock signal $S_{QCLK}$ undesirably lags clock signal $S_{DCLK}$, synchronization circuit 140 ensures that clock signal $S_{QCLK}$ moves from a lagging state to a leading state after the change in the reference clock signal provided to the signal conditioning system. In this way, synchronization circuit 140 ensures that clock signal $S_{QCLK}$ desirably leads clock signal $S_{DCLK}$. The operation of synchronization circuit 140 will be discussed in more detail with FIG. 13.

Figure 12:
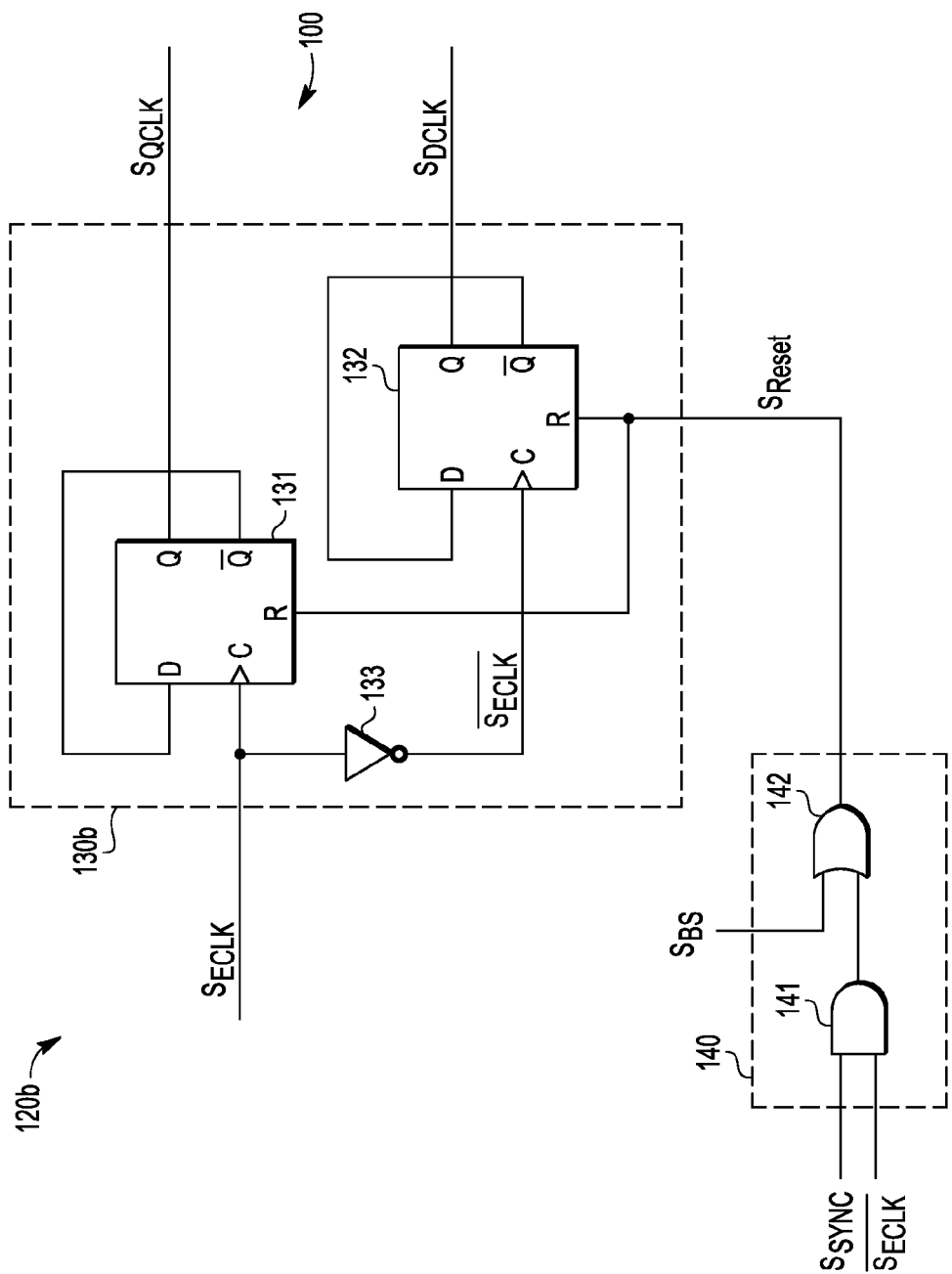

FIG. 12 is a circuit diagram 120b of another embodiment of clock conditioning circuit 100. In this embodiment, clock conditioning circuit 100 includes an encoding circuit 130b which includes D flip-flops 131 and 132. The clock input terminal of D flip-flop 131 receives encoded clock signal $S_{ECLK}$, and the clock input terminal of D flip-flop 132, receives encoded clock signal $S_{ECLK}$ through inverter 133. In this way, D flip-flop 131 is clocked by encoded clock signal $S_{ECLK}$ and D flip-flop 132 is clocked by the complement of encoded clock signal $S_{ECLK}$, which is denoted as $\overline{S_{ECLK}}$.

The data input terminal of D flip-flop 131 is connected to its $\overline{Q}$ output terminal, and the data input terminal of D flip-flop 132 is connected to its $\overline{Q}$ output terminal. The Q output terminal of D flip-flop 131 is not connected to the data input terminal of D flip-flop 132 so that D flip-flop 131 does not drive the operation of D flip-flop 132. The Q output terminals of D flip-flops 131 and 132 provide clock signals $S_{QCLK}$ and $S_{DCLK}$, respectively.

In this embodiment, circuit 120b includes synchronization circuit 140, which is connected to the reset input terminals of D flip-flops 131 and 132. The operation of synchronization circuit 140 will be discussed in more detail presently.

Clock conditioning circuit 100 embodied in circuit diagrams 120a and 120b of FIGS. 11 and 12, respectively, provides clock signals $S_{QCLK}$ and $S_{DCLK}$, which are down converted from reference signal $S_{REF}$, and phase-shifted relative to each other. Clock conditioning circuit 100 of circuit diagrams 120a and 120b include less complicated and less expensive circuitry, and better controls the frequency of clock signals $S_{QCLK}$ and $S_{DCLK}$, as well as the phase difference between them. Clock conditioning circuit 100 of circuit diagrams 120a and 120b is capable of providing clock signals $S_{QCLK}$ and $S_{DCLK}$ with a reduced amount of jitter. Further, clock conditioning circuit 100 of circuit diagrams 120a and 120b is capable of providing clock signals $S_{QCLK}$ and $S_{DCLK}$ without requiring an increase in frequency $f_{REF}$ to reduce the amount of jitter. In this way, clock conditioning circuit 100 of circuit diagrams 120a and 120b provides clock signals $S_{QCLK}$ and $S_{DCLK}$ without increasing the amount of power consumed.

Figure 13:
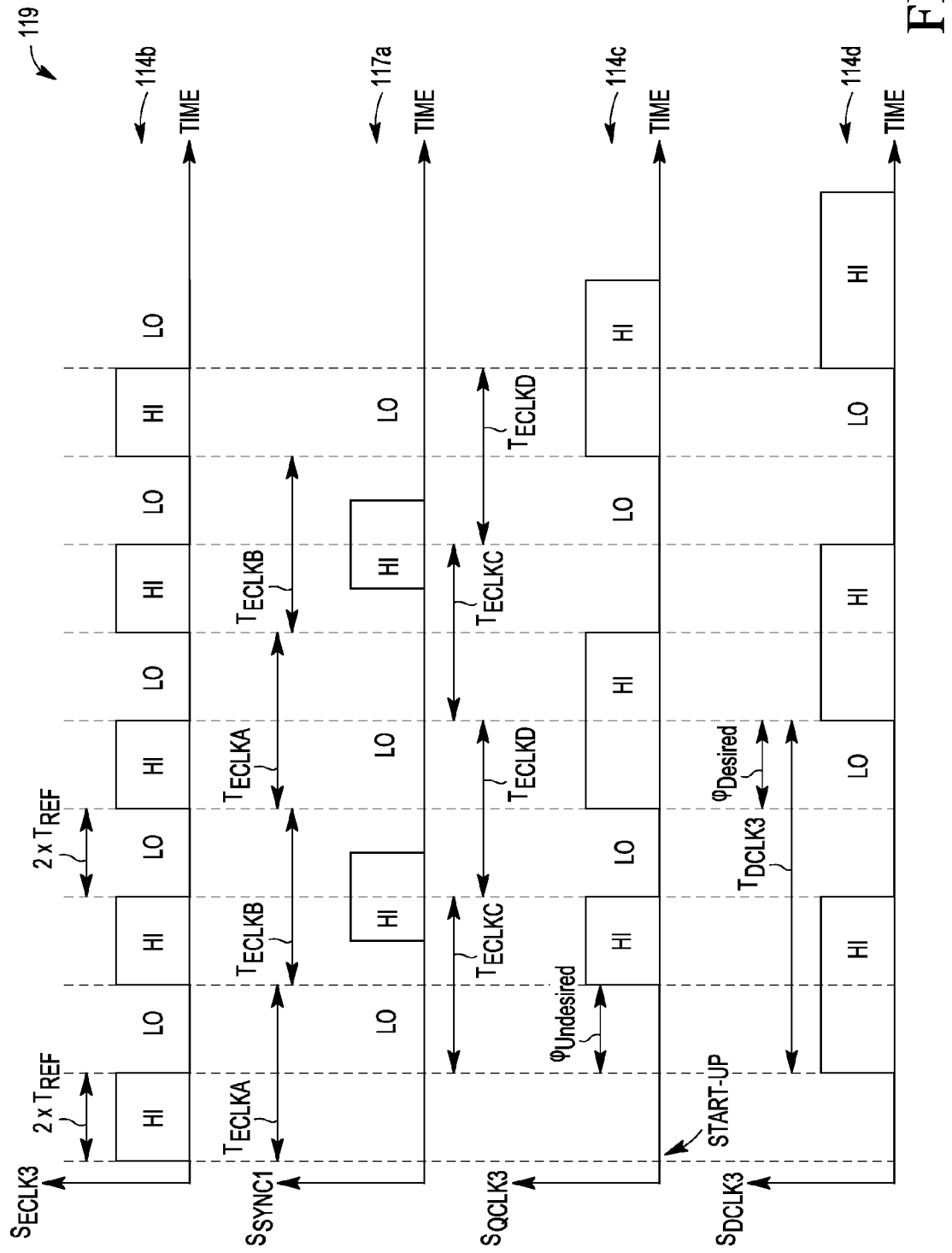
FIG. 13 is a timing diagram having graphs, which illustrate that the phase of clock signals $S_{QCLK}$ and $S_{DCLK}$ is adjustable in response to a synchronization signal $S_{SYNC1}$.

FIG. 13 is a timing diagram 119 having graphs 114b, 114c and 114d of FIG. 8, as well as a graph 117a showing a synchronization signal $S_{SYNC1}$ verses time. Synchronization circuit 140 and synchronization signal $S_{SYNC1}$ are used to reset clock conditioned signals $S_{QCLK}$ and $S_{DCLK}$ once per local period to ensure that the phase difference between clock signals $S_{QCLK}$ and $S_{DCLK}$ is driven to be the desired phase difference within one local period of clock conditioned signals $S_{QCLK}$ and $S_{DCLK}$.

In timing diagram 119, it is assumed that, at start-up, clock signal $S_{QCLK}$ undesirably lags clock signal $S_{DCLK}$ by a phase difference of $\phi_{Undesired}$, as indicated in graph 114c of timing diagram 119. Synchronization signal $S_{SYNC1}$ is a periodic digital signal having a HI state at the transition between the HI and LO states of encoded clock signal $S_{ECLK3}$ during local period $T_{ECLKB}$. Hence, in this example, synchronization signal $S_{SYNC}$ has a HI state at the falling edge of the HI state of encoded clock signal $S_{ECLK3}$ of local period $T_{ECLKB}$. Hence, the HI state of synchronization signal $S_{SYNC1}$ has a duration during the HI and LO states of encoded clock signal $S_{ECLK3}$. It should be noted that the duration of the HI state of synchronization signal $S_{SYNC1}$ is less than local period $T_{ECLKB}$ so that synchronization signal $S_{SYNC1}$ has a LO state during local period $T_{ECLKA}$.

The corresponding input terminal of AND gate 141 (FIGS. 11 and 12) provides a HI indication in response to the HI state of synchronization signal $S_{SYNC1}$. The other input terminal of AND gate 141 receives complementary encoded clock signal $\overline{S_{ECLK}}$, as shown in FIGS. 11 and 12. Hence, the other input terminal of AND gate 141 receives a signal which transitions from LO to HI in response to encoded clock signal $S_{ECLK3}$ transitioning from HI to LO during local period $T_{ECLKB}$.

A signal provided by the output terminal of AND gate 141 transitions from LO to HI states in response to encoded clock signal $S_{ECLK3}$ transitioning from HI to LO states during local period $T_{ECLKB}$. As mentioned above with FIGS. 11 and 12, the output terminal of AND gate 141 is connected to a corresponding input terminal of OR gate 142. Hence, the signal provided by the output terminal of OR gate 142 transitions from LO to HI state in response to the signal provided by the output terminal of AND gate 141 transitioning from LO to HI state.

Reset signal $S_{Reset}$ is provided by the output terminal of OR gate 142, which is connected to the reset terminals of flip-flops 131 and 132. Hence, reset signal $S_{Reset}$ transitions from LO to HI states in response to the signal provided by the output terminal of AND gate 141 transitioning from LO to HI states. Reset signal $S_{Reset}$ resets D flip-flops 131 and 132 in response to reset signal $S_{Reset}$ transitioning from LO to HI states. Clock signals $S_{QCLK}$ and $S_{DCLK}$ provided by the Q output terminals of D flip-flops 131 and 132, respectively, are driven to LO states in response to D flip-flops 131 and 132 being reset.

As mentioned above, the duration of the HI state of synchronization signal $S_{SYNC1}$ is less than local period $T_{ECLKB}$. The duration of the HI state of synchronization signal $S_{SYNC1}$ is less than local period $T_{ECLKB}$ so that reset signal $S_{Reset}$ transitions from a HI state to a LO state before the adjacent local period $T_{ECLKA}$ of encoded clock signal $S_{ECLK3}$ begins. It is desirable for reset signal $S_{Reset}$ to transition from a HI state to a LO state before the adjacent local period $T_{ECLKA}$ of encoded clock signal $S_{ECLK3}$ begins so that D flip-flops 131 and 132 will be responsive to the transitions of encoded clock signal $S_{ECLK}$ of the adjacent local period $T_{ECLKA}$.

Clock signal $S_{QCLK3}$ has a rising edge at the first rising edge of encoded clock signal $S_{ECLK3}$ after the HI state of synchronization signal $S_{SYNC1}$, as shown in graph 114c of timing diagram 119. The rising edge of clock signal $S_{QCLK3}$ at the first rising edge of encoded clock signal $S_{ECLK3}$ after the HI state of synchronization signal $S_{SYNC1}$ corresponds with the rising edge of the HI state of clock signal $S_{QCLK3}$ during local period $T_{ECLKA}$.

After synchronization signal $S_{SYNC1}$ transitions from the HI to the LO state of local period $T_{ECLKB}$, and before the next local period $T_{ECLKA}$, clock conditioning circuit 100 provides clock signals $S_{QCLK3}$ and $S_{DCLK3}$, as discussed in more detail above with FIG. 8. Hence, clock signal $S_{DCLK3}$ has a rising edge at the first falling edge of encoded clock signal $S_{ECLK3}$ after the HI state of synchronization signal $S_{SYNC1}$, as shown in graph 114d of timing diagram 119. Further, the rising edge of clock signal $S_{DCLK3}$ at the first falling edge of encoded clock signal $S_{ECLK3}$ after the HI state of synchronization signal $S_{SYNC1}$ corresponds with the rising edge of the HI state of clock signal $S_{DCLK3}$ during period $T_{ECLKB}$. Clock conditioning circuit 100 provides clock signal $S_{QCLK3}$ with HI and LO states of durations of local periods $T_{ECLKA}$ and $T_{ECLKB}$, respectively. Further, clock conditioning circuit 100 provides clock signal $S_{DCLK3}$ with HI and LO states of durations of local periods $T_{ECLKA}$ and $T_{ECLKB}$, respectively.

It should be noted that the rising edge of clock signal $S_{DCLK3}$ at the first failing edge of encoded clock signal $S_{ECLK3}$ occurs after a duration of $2 \times T_{REF}$ so that the phase between clock signals $S_{QCLK3}$ and $S_{DCLK3}$ is $2 \times T_{REF}$, which is phase $\phi_{Desired}$. Hence, synchronization circuit 140 drives the phase difference between clock signals $S_{QCLK3}$ and $S_{DCLK3}$ from phase $\phi_{Undesired}$ to phase $\phi_{Desired}$. Further, synchronization circuit 140 ensures that clock signal $S_{QCLK}$ moves from a lagging state to a leading state in response to turning on clock conditioning circuit 100. In this way, synchronization circuit 140 ensures that clock signal $S_{QCLK}$ desirably leads clock signal $S_{DCLK}$.

Synchronization signal $S_{SYNC1}$ is provided once per period of $S_{QCLK}$ and $S_{DCLK}$. $S_{SYNC1}$ occurs during the HI to LO transition of $S_{ECLK}$ during $T_{ECLKB}$. Thus within one period of startup or other event which causes $S_{QCLK}$ and $S_{DCLK}$ to become out of phase with one another, they will be reset to possess the correct relative phase with respect to one another. This feature is useful because at power-up either one or both of conditioned clock signals $S_{QCLK}$ or $S_{DCLK}$ could possess a relative polarity and phase which is undesirable.

It should be noted that synchronization circuit 140 is capable of adjusting the phase difference between other clock signals $S_{QCLK}$ and $S_{DCLK}$ in response to synchronization signal $S_{SYNC}$. For example, synchronization circuit 140 is capable of adjusting the phase difference between the clock signals discussed with FIGS. 6, 7, 8, 9 and 10.

Figure 14:
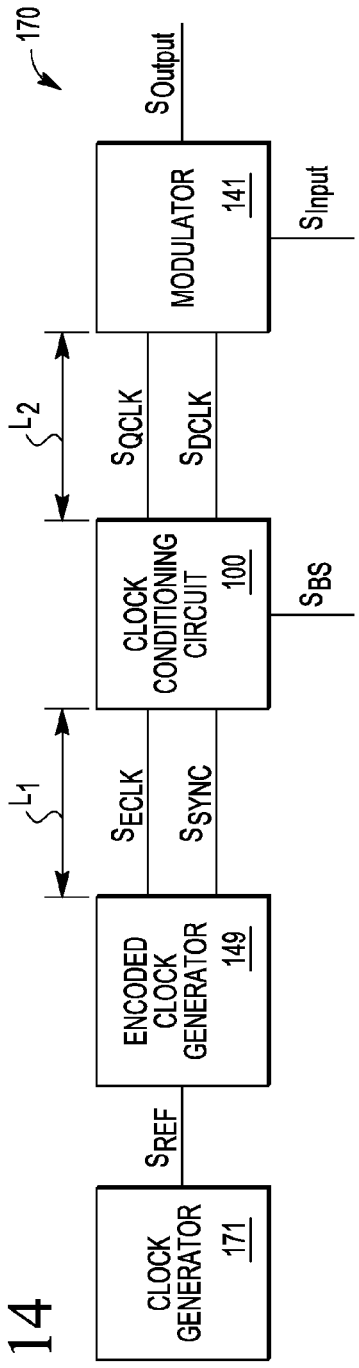
FIGS. 14, 15 and 16 are block diagrams of one embodiment of a signal conditioning system, which includes a modulator driven by the clock conditioning circuit of FIG. 1, wherein the clock conditioning circuit is driven by an encoded clock generator that provides encoded clock signal $S_{ECLK}$.
Figure 15:
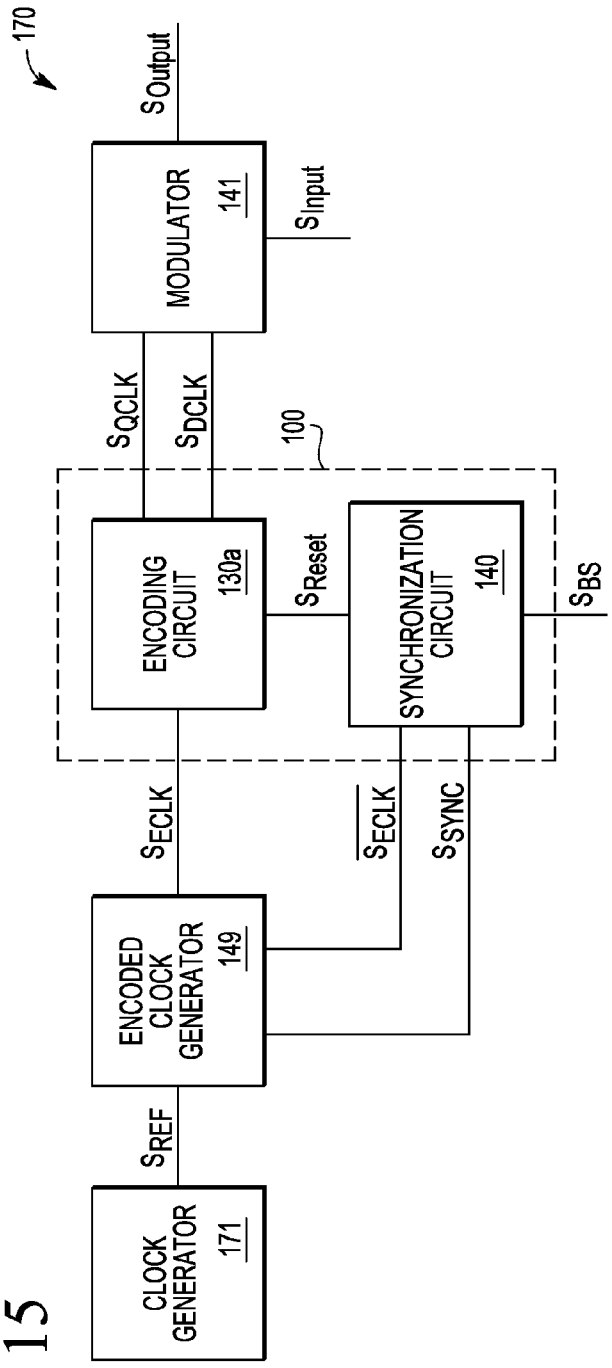
Figure 16:
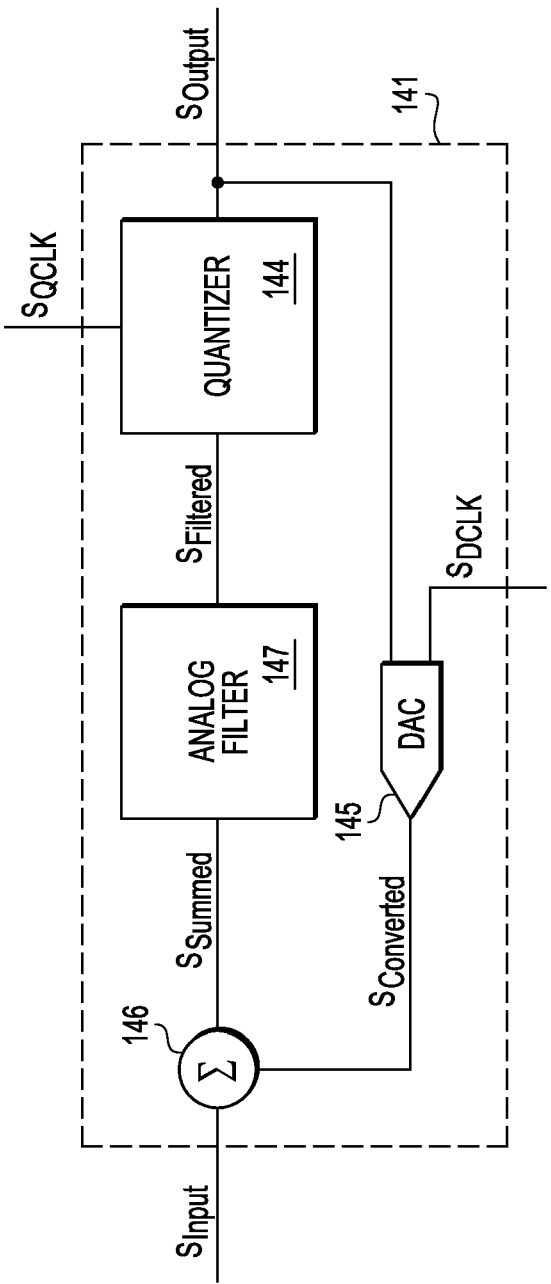

FIGS. 14, 15 and 16 are block diagrams of one embodiment of a signal conditioning system 170 which includes a modulator 141 driven by clock conditioning circuit 100, wherein clock conditioning circuit 100 is driven by an encoded clock generator 149. In this embodiment, encoded clock generator 149 receives reference signal $S_{REF}$ from clock generator 171 and provides encoded clock signal $S_{ECLK}$ to clock conditioning circuit 100 in response. It should be noted that clock generator 171 can be included with signal conditioning system 170, or it can be separate from signal conditioning system 170. Encoded clock generator 149 can include many different types of circuitry, such as a pulse generator, frequency synthesizer and phase-locked loop. In some embodiments, encoded clock generator 149 includes a pulse counter circuit which determines a predetermined number of periods of reference clock signal $S_{REF}$ and provides the rising and falling edges of encoded clock signal $E_{CLK}$ in response. The predetermined number of periods of reference clock signal $S_{REF}$ can change from one local period of encoded clock signal $E_{CLK}$ to an adjacent local period, and from one HI and LO state of encoded clock signal $E_{CLK}$ to adjacent next HI and LO state of encoded clock signal $E_{CLK}$. Encoded clock generator 149 provides encoded clock signal $S_{ECLK}$ with HI and LO states which correspond to a predetermined number of periods of reference clock signal $S_{REF}$. Encoded clock generator 149 adjusts the duration of the HI and LO states of encoded clock signal $S_{ECLK}$ in response to a change in the reference clock signal provided to encoded clock generator 149. As mentioned above, the available reference clock signals are at different frequencies, such as 1248 MHz and 1456 MHz. Hence, during some time intervals, reference clock signal $S_{REF}$ of FIGS. 14 and 15 has a frequency of 1248 MHz and during other time intervals, reference clock signal $S_{REF}$ of FIGS. 14 and 15 has a frequency of 1456 MHz. It should be noted that, in some situations, a single reference clock signal is provided to encoded clock generator, wherein the frequency of the single reference clock signal changes between 1248 MHz and 1456 MHz. However, in other situations, two separate reference clock signals are provided to encoded clock generator, wherein the frequency of one of the reference clock signals is 1248 MHz and the frequency of the other reference clock signal is 1456 MHz.

In this embodiment, clock conditioning circuit 100 includes encoding circuit 130a (FIG. 15) and synchronization circuit 140 (FIG. 11). Clock conditioning circuit 100 receives encoded clock signal $S_{ECLK}$ from encoded clock generator 149, and provides clock signals $S_{QCLK}$ and $S_{DCLK}$ in response, as described in more detail above with FIGS. 6, 7, 8, 9 10 and 13. In particular, encoding circuit 130a receives encoded clock signal $S_{ECLK}$ from encoded clock generator 149, and provides clock signals $S_{QCLK}$ and $S_{DCLK}$ in response. It should be noted that, in this embodiment, encoded clock generator 149 provides complementary encoded clock signal $\overline{S_{ECLK}}$ to clock conditioning circuit 100. However, as mentioned above with FIGS. 11 and 12, complementary encoded clock signal $\overline{S_{ECLK}}$ can be provided by an inverter included with encoding circuit 130a.

Clock conditioning circuit 100 receives synchronization signal $S_{SYNC}$ from encoded clock generator 149, and ensures that clock signal $S_{QCLK}$ desirably leads clock signal $S_{DCLK}$, as described in more detail above with FIG. 13. In particular, synchronization circuit 140 receives synchronization signal $S_{SYNC}$ from encoded clock generator 149, as shown in FIG. 15, and provides reset signal $S_{Reset}$ to encoding circuit 130a. It should be noted that clock conditioning circuit 100 can receive synchronization signal $S_{SYNC}$ from another component, which is not shown here.

Battery save signal $S_{BS}$ is provided to clock conditioning circuit. In particular, battery save signal $S_{BS}$ is provided to synchronization circuit 140, as discussed in more detail with FIGS. 11 and 12.

FIG. 16 is a block diagram of one embodiment of modulator 141. In this embodiment, modulator 141 includes a quantizer 144 which receives clock signal $S_{QCLK}$ from clock conditioning system 100 (FIGS. 14 and 15), and provides digital output signal $S_{Output}$ in response. Quantizer 144 samples an inputted analog signal at sampling rate $f_{Sample}$ of clock signal $S_{QCLK}$, and provides digital output signal $S_{Output}$ in response.

Modulator 141 includes a digital-to-analog converter (DAC) 145, which receives digital output signal $S_{Output}$ from quantizer 144 and clock signal $S_{DCLK}$ from clock conditioning system 100, and provides a converted analog signal $S_{Converted}$ in response. Converted analog signal $S_{Converted}$ is the analog signal representation of digital output signal $S_{Output}$.

Modulator 141 includes a summer 146 which receives converted analog signal $S_{Converted}$ and analog input signal $S_{Input}$, and combines them together to provide an analog summed signal $S_{Summed}$. Modulator 141 includes an analog filter 147 which receives analog summed signal $S_{Summed}$ and provides an analog filtered signal $S_{Filtered}$ to quantizer 144 as the inputted analog signal mentioned above. Quantizer 144 quantizes analog filtered signal $S_{Filtered}$ at a sampling rate corresponding to the frequency of clock signal $S_{QCLK}$. In this way, clock conditioning circuit 100 drives modulator 141.

Sampling rate $f_{Sample}$ and the phase difference between clock signal $S_{QCLK}$ and $S_{DCLK}$ determine the accuracy with which analog input signal $S_{Input}$ is resolved and represented by digital output signal $S_{Output}$. As mentioned above, digital output signal $S_{Output}$ is a more accurate representation of analog input signal $S_{Input}$ as the difference between signals $S_{Input}$ and $S_{Converter}$ decreases. Further, digital output signal $S_{Output}$ is a less accurate representation of analog input signal $S_{Input}$ as the difference between signals $S_{Input}$ and $S_{Converter}$ increases.

Clock conditioning circuit 100 provides clock signals $S_{QCLK}$ and $S_{DCLK}$ to modulator 141 with a reduced amount of jitter. Further, clock conditioning circuit 100 provides clock signals $S_{QCLK}$ and $S_{DCLK}$ to modulator 141 without requiring an increase in frequency $f_{REF}$ to reduce the amount of jitter. In this way, clock conditioning circuit 100 provides the desired clock signals without increasing the amount of power consumed by signal conditioning system 170.

It should be noted that clock conditioning circuit 100 allows the distance that clock signals $S_{QCLK}$ and $S_{DCLK}$ travel to decrease. As mentioned above, the phase difference between clock signals can randomly change in response to the clock signals traveling a distance. In general, the longer the distance the phase shifted clock signals travel, the more skew and attenuation they experience. Further, the shorter the distance the phase shifted clock signals travel, the less skew and attenuation they experience. It should be noted that the phase shifted clock signals typically travel along corresponding conductive lines which provide communication between clock conditioning circuit 100 and modulator 141. The phase difference between clock signals can randomly change because the clock signals are randomly and independently skewed in response to traveling the distance. The random change in the phase difference between the clock signals in response to skew is often uncontrollable and can cause jitter, which reduces the accuracy of the digital signal provided by modulator 141.

FIG. 14 shows distances $L_1$ and $L_2$, wherein distance $L_1$ corresponds with the distance clock signals $S_{ECLK}$ and $S_{SYNC}$ travel between encoded clock generator 149 and clock conditioning circuit 100, and distance $L_2$ corresponds with the distance clock signals $S_{QCLK}$ and $S_{DCLK}$ travel between clock conditioning circuit 100 and modulator 141. As distance $L_2$ increases, clock signals $S_{QCLK}$ and $S_{DCLK}$ experience more skew and attenuation, and the accuracy in which modulator 141 provides output signal $S_{Output}$ decreases. As distance $L_2$ decreases, clock signals $S_{QCLK}$ and $S_{DCLK}$ experience less skew and attenuation, and the accuracy in which modulator 141 provides output signal $S_{Output}$ increases. Hence, the skew and attenuation experienced by clock signals $S_{QCLK}$ and $S_{DCLK}$ is reduced, and the accuracy of the output signal $S_{Output}$ is increased, in response to positioning clock conditioning circuit 100 closer to modulator 141. Further, the skew and attenuation experienced by clock signals $S_{QCLK}$ and $S_{DCLK}$ is increased, and the accuracy of the output signal $S_{Output}$ is decreased, in response to positioning clock conditioning circuit 100 further away from modulator 141.

Encoded clock generator 149 can be positioned a wider range of distances away from clock conditioning circuit 100 and modulator 141 because any skew experienced by encoded clock signal $S_{ECLK}$ will not substantially affect the accuracy with which modulator 141 provides output signal $S_{Output}$. As distance $L_1$ increases, the skew experienced by encoded clock signal $S_{ECLK}$ will not substantially affect the accuracy in which modulator 141 provides output signal $S_{Output}$. As distance $L_1$ decreases, the skew experienced by encoded clock signal $S_{ECLK}$ will not substantially affect the accuracy in which modulator 141 provides output signal $S_{Output}$. In this way, clock conditioning circuit 100 increases the accuracy in which modulator 141 provides output signal $S_{Output}$.

However, the ability of clock conditioning circuit 100 to determine the HI and LO states of encoded clock signal $S_{ECLK}$ does depend on distance $L_1$. As distance $L_1$ increases, the HI and LO states of encoded clock signal $S_{ECLK}$ are attenuated and skewed more, and clock conditioning circuit 100 is less likely to be able to determine them. As distance $L_1$ decreases, the HI and LO states of encoded clock signal $S_{ECLK}$ are attenuated less, and clock conditioning circuit 100 is more likely to be able to determine them. In this way, the ability of clock conditioning circuit 100 to determine the HI and LO states of encoded clock signal $S_{ECLK}$ does depend on distance $L_1$. The amount of attenuation and skew experienced by encoded clock signal $S_{ECLK}$ can be decreased in response to increasing the amount of power of encoded clock signal $S_{ECLK}$. The amount of power of encoded clock signal $S_{ECLK}$ is determined by encoded clock generator 149. The ability of clock conditioning circuit 100 to determine the phase difference between signals does not depend on the distance that encoded clock generator 149 is positioned away from modulator 141. Hence, clock conditioning circuit 100 allows encoded clock generator 149 to be positioned a larger distance $L_1$ away from clock conditioning circuit 100 and modulator 141 without decreasing the accuracy of the digital signal provided by modulator 141.

Embodiments which include clock conditioning circuit 100 and encoded clock generator 149 are different from embodiments in which a clock generator provides phase shifted clock signals to modulator 141 because in this situation the accuracy of the digital signal does depend on the distance between the clock generator and modulator 141.

Figure 17:
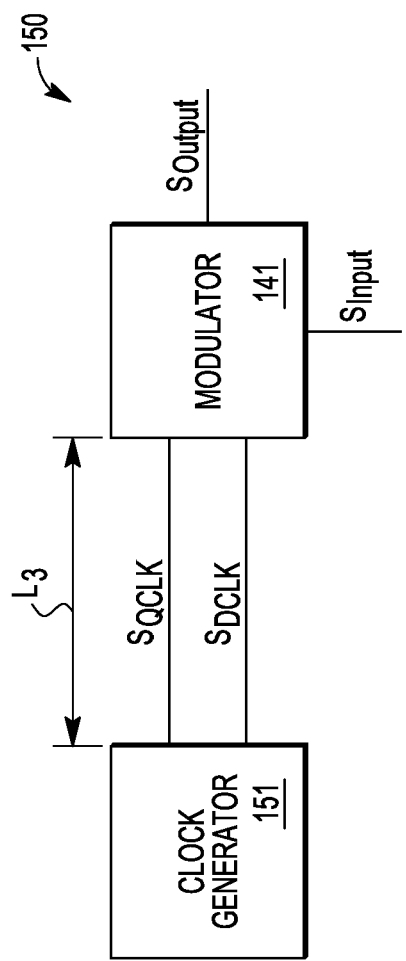
FIG. 17 is a block diagram of a circuit without a clock conditioning circuit, where a clock generator is providing phase adjusted clock signals $S_{QCLK}$ and $S_{DCLK}$.

FIG. 17 is a block diagram of a circuit 150 which includes a clock generator 151 that provides phase shifted clock signals $S_{QCLK}$ and $S_{DCLK}$ signals to modulator 141. In this example, clock generator 151 is positioned a distance $L_3$ from modulator 141, so that phase shifted clock signals $S_{QCLK}$ and $S_{DCLK}$ signals travel distance $L_3$. As the clock signals $S_{QCLK}$ and $S_{DCLK}$ travel distance $L_3$, their phases can undesirably change relative to one another in an uncontrollable manner, as discussed in more detail above. This uncontrollable change in phase of clock signals $S_{QCLK}$ and $S_{DCLK}$ reduces the accuracy with which modulator 141 provides output signal $S_{Output}$. As distance $L_3$ increases, clock signals $S_{QCLK}$ and $S_{DCLK}$ experience more skew and attenuation, and the accuracy in which modulator 141 provides output signal $S_{Output}$ decreases. As distance $L_3$ decreases, clock signals $S_{QCLK}$ and $S_{DCLK}$ experience less skew and attenuation, and the accuracy in which modulator 141 provides output signal $S_{Output}$ increases. Hence, in circuit 150, the amount of skew and attenuation experienced by clock signals $S_{QCLK}$ and $S_{DCLK}$, and the accuracy of output signal $S_{Output}$, undesirably depends on distance $L_3$.

FIG. 18 is a flow diagram of a method 200 of providing a conditioned clock signal. In this embodiment, method 200 includes a step 201 of receiving, with a clock conditioning circuit, an encoded clock signal. The clock conditioning circuit provides first and second conditioned clock signals in response to receiving the encoded clock signal. Method 200 includes a step 202 of adjusting, with the clock conditioning circuit, a period of the first and second conditioned clock signals in response to an adjustment of a period of the encoded clock signal.

It should be noted that method 200 can include many other steps. For example, in some embodiments, method 200 includes providing the first and second conditioned clock signals to a modulator. The clock conditioning circuit can adjust the duty cycle of the first and second conditioned clock signals in response to an adjustment of a period of the encoded clock signal. The clock conditioning circuit can adjust the symmetry of the first and second conditioned clock signals in response to an adjustment of the symmetry of the encoded clock signal. The clock conditioning circuit can adjust the phase difference between the first and second conditioned clock signals in response to an adjustment of a period of the encoded clock signal. The clock conditioning circuit can adjust the phase of the second conditioned clock signal in response to an adjustment of the phase of the first conditioned clock signal relative to a reference clock signal.

In method 200, the clock conditioning circuit can drive the first and second conditioned clock signals to a predetermined value in response to an indication from a synchronization signal. In some embodiments, the first and second conditioned clock signals are driven to the same value. Further, the clock conditioning circuit can drive the period of the first conditioned clock signal to be a desired fraction of the period of a reference clock signal.

FIG. 19 is a flow diagram of a method 210 of providing a conditioned clock signal. In this embodiment, method 210 includes a step 211 of receiving an encoded clock signal with a clock conditioning circuit. The clock conditioning circuit provides first and second conditioned clock signals in response to receiving the encoded clock signal. Method 210 includes a step 212 of driving, with the clock conditioning circuit, a phase difference between the first and second conditioned clock signals to a phase difference determined by a period of the encoded clock signal.

Method 210 can include many other steps. For example, method 210 can include receiving the first and second conditioned clock signals with a modulator. Method 210 can include adjusting, with the clock conditioning circuit, HI and LO states of the first conditioned clock signal in response to an adjustment of the duration of HI and LO states of the encoded clock signal. The duration of the HI and LO states of encoded clock signal $S_{ECLK1}$ correspond to a predetermined number of periods of reference clock signal $S_{REF}$. Method 210 can include adjusting, with the clock conditioning circuit, the phase of the second conditioned clock signal in response to an adjustment of the duration of the HI state of the encoded clock signal. Method 210 can include adjusting, with the clock conditioning circuit, a duty cycle of the first conditioned clock signal in response to an adjustment of the duration of the HI and LO states of the encoded clock signal. Method 210 can include adjusting, with the clock conditioning circuit, a phase difference in response to a change in the duration of the HI and LO states of the encoded clock signal.

Method 210 can include changing, with the clock conditioning circuit, the state of the second conditioned clock signal in response to an indication from a synchronization signal.

FIG. 20 is a flow diagram of a method 220 of providing a conditioned clock signal. In this embodiment, method 220 includes a step 221 of receiving, with a clock conditioning circuit, an encoded clock signal. The clock conditioning circuit provides first and second conditioned clock signals in response to receiving the encoded clock signal. Method 220 includes a step 222 of adjusting, with the clock conditioning circuit, a duty cycle of the first and second conditioned clock signals in response to an adjustment of a period of the encoded clock signal.

It should be noted that method 220 can include many other steps. For example, in some embodiments, method 220 includes providing the first and second conditioned clock signals to a modulator. The clock conditioning circuit can adjust a period of the first and second conditioned clock signals in response to an adjustment of a period of the encoded clock signal. The clock conditioning circuit can adjust the symmetry of the first and second conditioned clock signals in response to an adjustment of the symmetry of the encoded clock signal. The clock conditioning circuit can adjust a phase difference between the first and second conditioned clock signals in response to an adjustment of a period of the encoded clock signal. The clock conditioning circuit can adjust the phase of the second conditioned clock signal in response to an adjustment of the phase of the first conditioned clock signal.

In method 220, the clock conditioning circuit can drive the first and second conditioned clock signals to a predetermined value in response to an indication from a synchronization signal. In some embodiments, the first and second conditioned clock signals are driven to the same value. Further, the clock conditioning circuit can drive a period of the first conditioned clock signal to be a desired fraction of the period of a reference clock signal.

Figure 21:
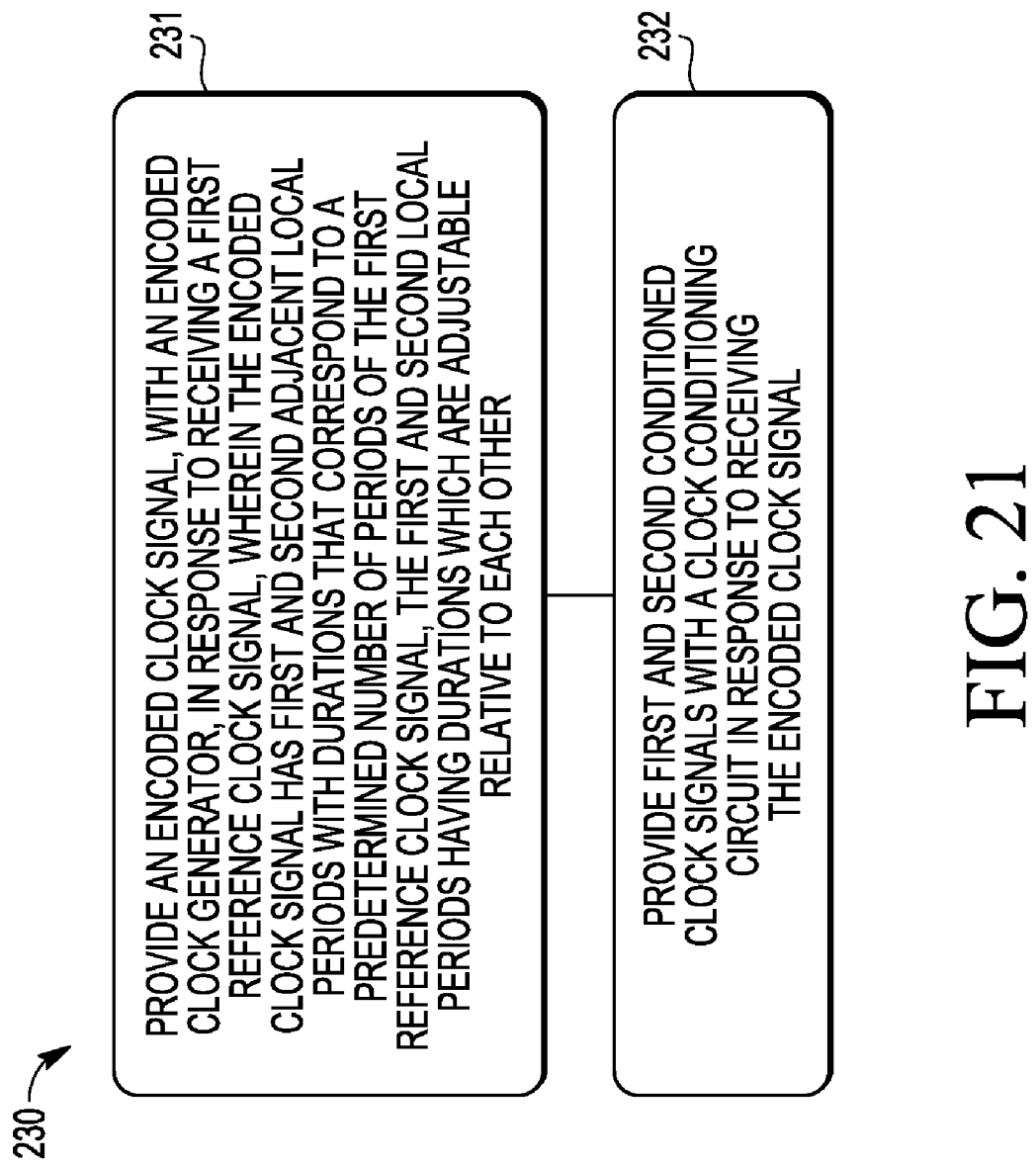

FIG. 21 is a flow diagram of a method 230 of providing a conditioned clock signal. In this embodiment, method 230 includes a step 231 of providing, with an encoded clock generator, an encoded clock signal in response to receiving, with the encoded clock generator, a first reference clock signal, wherein the encoded clock signal has first and second adjacent local periods with durations that correspond to a predetermined number of periods of the first reference clock signal, the first and second local periods having durations which are adjustable relative to each other. Method 230 includes step 232 of providing first and second conditioned clock signals with a clock conditioning circuit in response to receiving the encoded clock signal.

It should be noted that method 230 can include many other steps. For example, in some embodiments, method 230 includes flowing the first and second conditioned clock signals to a modulator. The first and second local periods of the encoded clock signal can have durations which are not equal to each other. Method 230 can include adjusting, with the clock conditioning circuit, a duty cycle of the first and second conditioned clock signals in response to an adjustment of the first and second adjacent local periods of the encoded clock signal. The clock conditioning circuit can adjust a local period of the first conditioned clock signal in response to an adjustment of the first and second local periods of the encoded clock signal. The clock conditioning circuit can adjust a phase difference between the first and second conditioned clock signals in response to an adjustment of a duty cycle of the encoded clock signal. Method 230 can include adjusting, with the encoded clock generator, the durations of the first and second adjacent local periods in response to the encoded clock generator receiving a second reference clock signal, wherein the durations of the first and second adjacent local periods are adjusted to correspond to a predetermined number of periods of the second reference clock signal. The clock conditioning circuit can drive the first and second conditioned clock signals to a predetermined value in response to an indication from a synchronization signal.

Although the invention is described herein with reference to specific embodiments, various modifications and changes can be made without departing from the scope of the present invention as set forth in the claims below. For example, the conditioned clock signals can be used to support circuits other than sigma-delta modulators. The frequencies can vary, and the number of conditioned clock signals can be more than two. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit, comprising:
   an encoded clock generator which provides an encoded clock signal in response to receiving a reference clock signal, wherein the encoded clock signal has first and second adjacent local periods with durations that correspond to a predetermined number of periods of the reference clock signal, the first and second adjacent local periods having HI and LO states with adjustable durations;
   a clock conditioning circuit which receives the encoded clock signal, and provides first and second conditioned clock signals in response, wherein the clock conditioning circuit drives a phase difference between the first and second conditioned clock signals to a phase difference that corresponds to the duration of one of the HI and LO states of the encoded clock signal; and
   a modulator which receives the first and second conditioned clock signals.

2. The circuit of claim 1, wherein the clock conditioning circuit provides the first conditioned clock signal with a HI state having a duration that corresponds to a duration of the first local period of the encoded clock signal.

3. The circuit of claim 2, wherein the clock conditioning circuit provides the first conditioned clock signal with a LO state having a duration that corresponds to a duration of the second local period of the encoded clock signal.

4. The circuit of claim 1, wherein the clock conditioning circuit adjusts the phase difference between the first and second conditioned clock signals in response to an adjustment of the duration of a HI state of the encoded clock signal.

5. The circuit of claim 1, wherein the clock conditioning circuit adjusts a duty cycle of the first conditioned clock signal in response to an adjustment of the duration of HI and LO states of the encoded clock signal.

6. The circuit of claim 1, wherein the clock conditioning circuit drives the first and second conditioned clock signals to a predetermined value in response to an indication from a synchronization signal.

7. A circuit, comprising:
   an encoded clock generator which provides an encoded clock signal in response to receiving a reference clock signal, wherein the encoded clock signal includes first and second adjacent local periods with durations that correspond to a predetermined number of periods of the reference clock signal, the first and second adjacent local periods having durations adjustable relative to each other;
   a clock conditioning circuit which receives the encoded clock signal, and provides first and second conditioned clock signals in response, wherein the first conditioned clock signal has a local period equal to the sum of the first and second adjacent local periods of the encoded clock signal; and
   a modulator which receives the first and second conditioned clock signals.

8. The circuit of claim 7, wherein the clock conditioning circuit adjusts a duty cycle of the first conditioned clock signal in response to an adjustment of the duration of the first and second adjacent local periods of the encoded clock signal.

9. The circuit of claim 7, wherein the clock conditioning circuit adjusts the local period of the first conditioned clock signal in response to an adjustment of the first and second adjacent local periods of the encoded clock signal.

10. The circuit of claim 7, wherein the encoded clock signal has third and fourth local periods which are adjacent to each other and have adjustable durations that correspond to a predetermined number of periods of the reference clock signal, the third local period lags the first local period by a predetermined amount of time.

11. The circuit of claim 10, wherein the second conditioned clock signal has a local period equal to the sum of the third and fourth adjacent local periods of the encoded clock signal.

12. The circuit of claim 7, wherein the clock conditioning circuit provides the first conditioned clock signal with a HI state having a duration that corresponds to the duration of the first local period of the encoded clock signal and a LO state having a duration that corresponds to the duration of the second local period of the encoded clock signal.

13. The circuit of claim 7, wherein the clock conditioning circuit drives the first and second conditioned clock signals to a predetermined value in response to an indication from a synchronization signal.

14. A method of driving a modulator, comprising:
providing an encoded clock signal, with an encoded clock generator, in response to receiving a first reference clock signal, wherein the encoded clock signal has first and second adjacent local periods with durations that correspond to a predetermined number of periods of the first reference clock signal, the first and second local periods having durations which are adjustable relative to each other;
providing first and second conditioned clock signals with a clock conditioning circuit in response to receiving the encoded clock signal; and
flowing the first and second conditioned clock signals to a modulator.

15. The method of claim 14, wherein the first and second local periods have durations which are not equal to each other.

16. The method of claim 14, further including adjusting, with the clock conditioning circuit, a duty cycle of the first and second conditioned clock signals in response to an adjustment of the first and second adjacent local periods of the encoded clock signal.

17. The method of claim 14, further including adjusting, with the clock conditioning circuit, a local period of the first conditioned clock signal in response to an adjustment of the first and second local periods of the encoded clock signal.

18. The method of claim 14, further including adjusting, with the clock conditioning circuit, a phase difference between the first and second conditioned clock signals in response to an adjustment of a duty cycle of the encoded clock signal.

19. The method of claim 14, further including adjusting, with the encoded clock generator, the durations of the first and second adjacent local periods in response to the encoded clock generator receiving a second reference clock signal, wherein the durations of the first and second adjacent local periods are adjusted to correspond to a predetermined number of periods of the second reference clock signal.

20. The method of claim 14, further including driving, with the clock conditioning circuit, the first and second conditioned clock signals to a predetermined value in response to an indication from a synchronization signal.

* * * * *